United States Patent
Purcell et al.

(10) Patent No.: US 11,406,036 B2
(45) Date of Patent: Aug. 2, 2022

(54) FLEXIBLE I/O SERVER INTERFACE CARD ORIENTATION

(71) Applicant: HEWLETT PACKARD ENTERPRISE DEVELOPMENT LP, Houston, TX (US)

(72) Inventors: Brian T. Purcell, Tomball, TX (US); Steven Dean, Rocklin, CA (US); Harvey J. Lunsman, Chippewa Falls, WI (US); Jonathan Daniel Befort, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 343 days.

(21) Appl. No.: 16/682,077

(22) Filed: Nov. 13, 2019

(65) Prior Publication Data
US 2021/0144875 A1    May 13, 2021

(51) Int. Cl.
| | |
|---|---|
| *G06F 1/22* | (2006.01) |
| *H05K 7/14* | (2006.01) |
| *H05K 7/10* | (2006.01) |
| *G06F 1/16* | (2006.01) |
| *H05K 5/00* | (2006.01) |
| *G06F 13/00* | (2006.01) |

(52) U.S. Cl.
CPC ......... *H05K 7/1429* (2013.01); *G06F 1/1658* (2013.01); *G06F 1/22* (2013.01); *G06F 13/00* (2013.01); *H05K 5/0069* (2013.01); *H05K 7/10* (2013.01)

(58) Field of Classification Search
CPC .......... G06F 1/1658; G06F 1/22; G06F 13/00; H05K 7/1429; H05K 7/10; H05K 5/0069
See application file for complete search history.

(56) References Cited

U.S. PATENT DOCUMENTS

| | | | |
|---|---|---|---|
| 7,561,439 B2* | 7/2009 | Orr ........................ | G06F 1/185 361/724 |
| 7,746,654 B2* | 6/2010 | Franz ..................... | G06F 1/185 361/724 |
| 9,298,228 B1* | 3/2016 | Abhyankar ............ | G06F 1/185 |
| 9,841,791 B2* | 12/2017 | Mullen ............. | H05K 7/20709 |

(Continued)

*Primary Examiner* — Henry Tsai
*Assistant Examiner* — Christopher A Daley
(74) *Attorney, Agent, or Firm* — Nolte Intellectual Property Law Group

(57) ABSTRACT

A flexible input/output (I/O) expansion card connection and communication technique are provided. The flexible I/O expansion card is, in some examples, a mezzanine expansion card that may be a single width mezzanine expansion card, a double width expansion card, or a quad width expansion card. Multiple connectors on a mainboard provide a slot to receive plug in (insertion) of an expansion card. A slot is associated with a communication bus (e.g., Peripheral Component Interconnect (PCI)) established between the expansion card and an associated processor. The expansion card (or more than one expansion card) may be inserted in multiple orientations with respect to the multiple connectors. Automatic adjustment of communication on the communication bus may be implemented via one or more hardware level and/or software assisted translations to allow the mezzanine expansion card to function in a normal or a reverse (180 degrees relative to normal) orientation.

20 Claims, 18 Drawing Sheets

(56) References Cited

U.S. PATENT DOCUMENTS

| | | | |
|---|---|---|---|
| 10,381,761 B2 * | 8/2019 | Jau .................... | H01R 12/675 |
| 10,956,353 B1 * | 3/2021 | Bailey ................ | G06F 13/4282 |
| 2008/0304223 A1 * | 12/2008 | Franz .................. | G06F 1/185 |
| | | | 361/737 |
| 2011/0040916 A1 * | 2/2011 | Atherton ............ | G06F 13/4295 |
| | | | 710/300 |
| 2016/0037673 A1 * | 2/2016 | Chen .................. | H05K 7/1489 |
| | | | 361/679.02 |
| 2017/0083057 A1 * | 3/2017 | Bettiga ................ | G06F 1/185 |

* cited by examiner

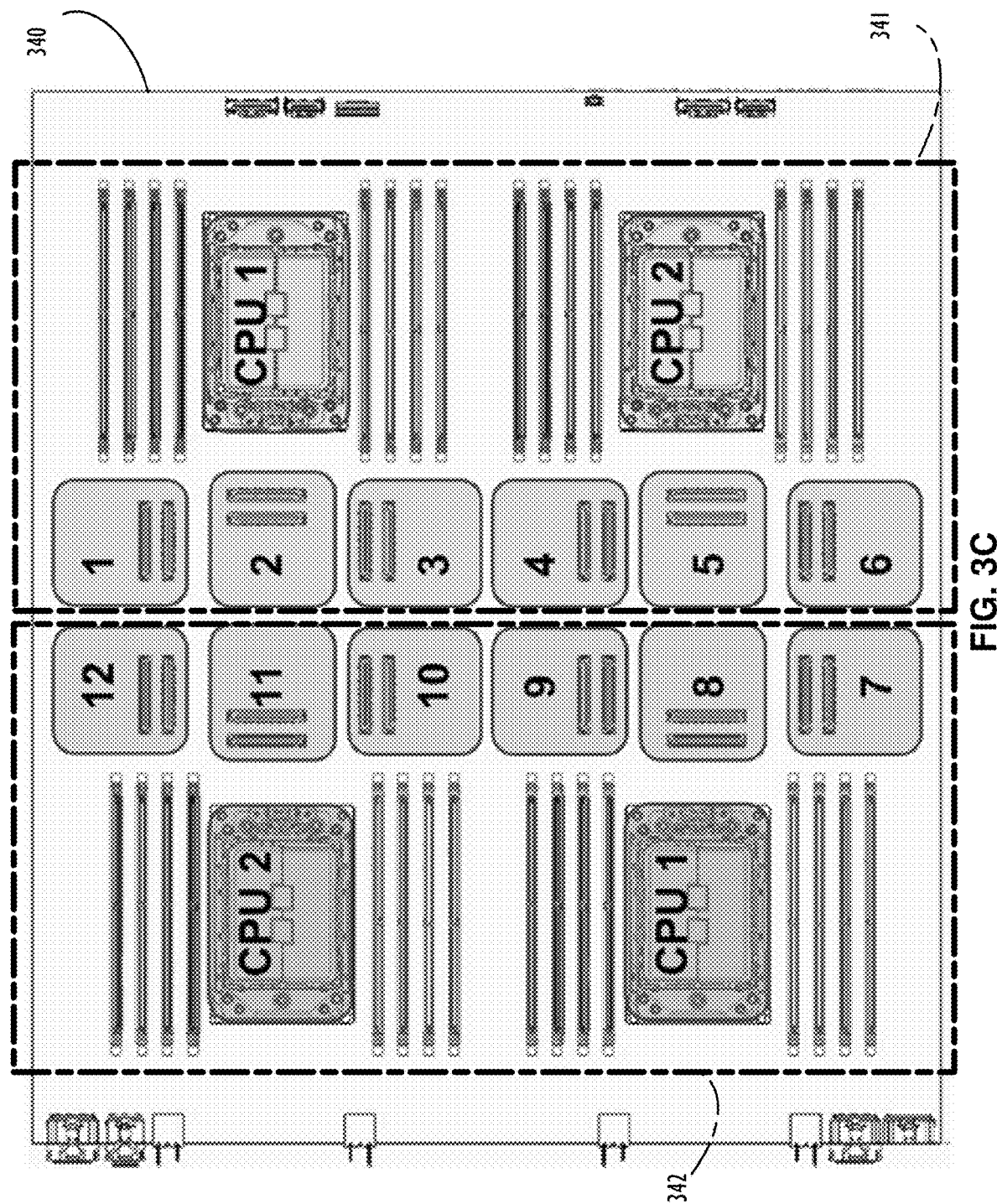

FLEXIBLE I/O SERVER INTERFACE CARD ORIENTATION

BACKGROUND

Computer devices typically have a mainboard (e.g., motherboard or backplane) that includes slots for "expansion cards." Expansion cards typically provide extended capabilities that may not be present on the mainboard (e.g., a capability completely lacking from the mainboard processors). In some cases, expansion cards provide additional resources to augment capabilities of the mainboard (e.g., a graphics accelerator to augment a graphics processor on the mainboard). In one example, a mainboard may have a single I/O port for base functionality and an expansion card may be plugged in (i.e., inserted into a slot) to the mainboard to provide multiple I/O ports. In another example, a graphics card may be plugged into the mainboard to provide graphics capability that is not present or capable of being performed by processors of the mainboard. Other types of expansion cards are also common. In this manner, a base mainboard may be designed and then later customized for different applications by adding additional expansion cards.

Slots and expansion cards typically utilize an orientation that matches with each other so that communication bus "pin outs" are aligned properly for processing data. In some cases, an expansion slot and a corresponding expansion card may be "keyed" such that the expansion card may only be inserted in a single orientation. The slot and the portion of the expansion card that plugs into the slot typically form one or more communication busses to allow communication between the processor(s) on the expansion card and the processor(s) on the mainboard. Examples of communication busses include Peripheral Component Interconnect (PCI), PCI Express (PCIe), Small Computer System Interface (SCSI), and Serial AT Attachment (SATA); to name a few. Each of these communication busses have variations and may evolve over time although they typically conform to an industry standard at some level to allow for compatibility.

Expansion cards may have different shapes and sizes (e.g., a "form factor") to conform to the computer system in which they are expected to be added. One example shape is referred to as a "mezzanine" card because it plugs in and then operates at a mezzanine level above and parallel to the mainboard as opposed to extending at a straight 90 degree angle. That is, a mezzanine expansion card may be stacked like the mezzanine of a theater and be of different heights (sometimes referred to as levels in a Z-coordinate direction of a mainboard in an X-Y plane). Some mezzanine expansion cards are referred to as single width or double width depending on how many slots they concurrently plug into on the mainboard (e.g., number of slots equals the "width"). Other terms are used for expansion cards and they are sometimes referred to as one of "daughter boards, daughter cards, riser cards, or piggyback boards." This is a non-exhaustive list of terms for expansion cards.

BRIEF DESCRIPTION OF THE DRAWINGS

The present disclosure may be better understood from the following detailed description when read with the accompanying Figures. It is emphasized that, in accordance with standard practice in the industry, various features are not drawn to scale. In fact, the dimensions or locations of functional attributes may be relocated or combined based on design, security, performance, or other factors known in the art of computer systems. Further, order of processing may be altered for some functions, both internally and with respect to each other. That is, some functions may not require serial processing and therefore may be performed in an order different than shown or possibly in parallel with each other. For a detailed description of various examples, reference will now be made to the accompanying drawings, in which:

FIG. 3C illustrates multiple compute nodes on a single mainboard with each of the multiple compute nodes including multiple processor units, according to one or more disclosed implementations;

DETAILED DESCRIPTION

Figure 1:
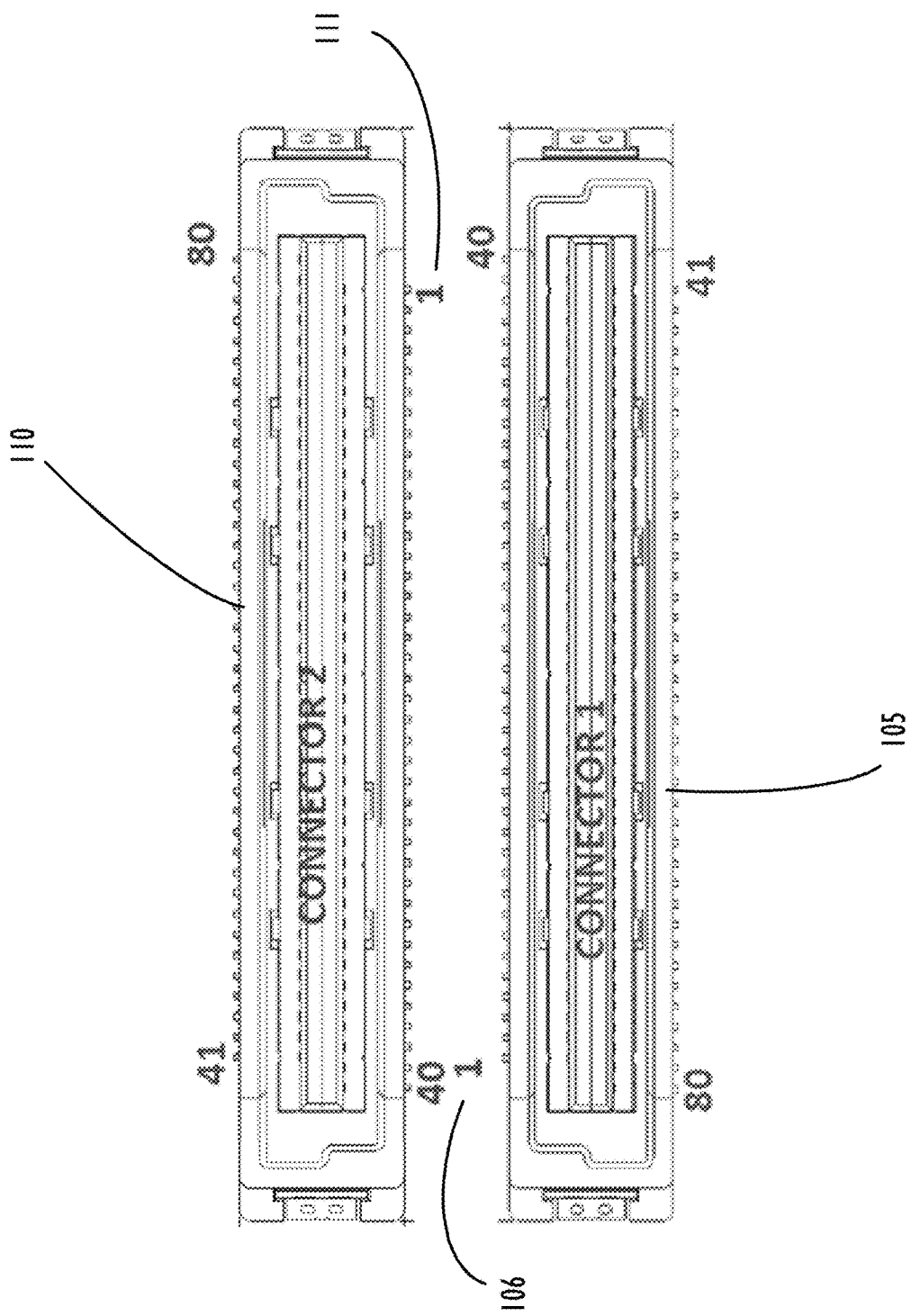
FIG. 1 illustrates an example of a set of connectors working together to allow connection of an expansion card, such as a mezzanine expansion card to support connection to a network fabric, according to one or more disclosed implementations.

Illustrative examples of the subject matter claimed below will now be disclosed. In the interest of clarity, not all features of an actual implementation are described for every example implementation in this specification. It will be appreciated that in the development of any such actual example, numerous implementation-specific decisions may be made to achieve the developer's specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

A single width mezzanine expansion card and double width mezzanine expansion cards are different form factors of expansion cards. The "width" indication refers to the number of concurrently plugged in slots that are occupied by a single expansion card. Slots may also be associated with a set of plug in "connectors" in this disclosure. A slot may be formed from one or more connectors. In the examples of this disclosure, two connectors together form a single slot. However, it is common for a single connector to be used for a single slot. Thus a "slot" in the context of this disclosure, refers to a logical construct associated with a communication bus rather than a physical plug in connection (i.e., a connector as described herein).

For the purposes of the examples of this disclosure, a single width mezzanine expansion card plugs into a single slot (which may be formed from a set of connectors) and used for a single communication bus (e.g., PCIe bus) between the expansion card and the mainboard. A double width mezzanine expansion card would plug into two slots (e.g., four connectors in the examples herein) at the same time and each of the slots may form an independent communication bus. Accordingly, a double width mezzanine expansion card may be plugged into a mainboard that has two different central processing units (CPUs) and the double width mezzanine expansion card may form two independent PCI communication busses with each one being dedicated to one of the two CPUs. This concept of "width" may be extrapolated to an expansion card that concurrently plugs into any number of slots concurrently and creates a corresponding number of independent communication busses.

Examples in this disclosure include at least a quad level mezzanine expansion card that creates four independent communication busses. Further numbers are possible but not specifically illustrated. As the number of concurrently used slots increase the possible number of orientations for the expansion card may be decreased, in part, because of the physical dimensions to allow alignment of the expansion card plug would be decreased with respect to physical access to the multiple slots. In most cases, there will be at least two possible orientations for plug in of an expansion card. These two orientations are made possible by a rotation of the mezzanine expansion card in a clockwise or counterclockwise manner by 180 degrees.

Form factors (e.g., the size and shape of a manufactured card) of mezzanine expansion cards may differ for different applications. Form factors may also be different based on expected cooling mechanisms of the computer system for which they are intended. For example, form factors may be different if a computer system is to be air cooled, as opposed to liquid cooled. Specifically, in an air cooled computer there may be additional space between the mainboard and the mezzanine board to allow for sufficient air flow to cool the processors of the mainboard and the expansion card. In a liquid cooled environment, the space allocated for liquid flow to achieve proper cooling may be less than that of an air cooled implementation. However, the amount of cooling implemented may vary greatly and may depend on the number of processors and their proximity to each other when the expansion card is connected to the mainboard.

Computers in a data center may be utilized to execute multiple physical nodes that may each contain one or more virtual machines (VMs) that individually represent a virtual computer resource. Each physical node may be connected to a network fabric via a fabric connector. More than one physical node may be implemented on a single mainboard of a physical node. In some cases, multiple physical nodes on a single mainboard may share a fabric connector. In addition (or alternatively) multiple processors of a single physical node may share a fabric connector. The fabric connector may communicate to processors of an associated mainboard in the computer device via the Peripheral Component Interconnect Express (PCIe) bus slot on the computer mainboard (e.g., a motherboard) or may be communicatively coupled to the computer in some other manner.

In general, network fabric data that is to be delivered to a process running on a particular physical node would a) be routed through the network switching/routing services of the network fabric to arrive at the fabric connector, and b) transferred locally (e.g., via PCIe) on the mainboard between the fabric connector and a processor occupying a socket of the mainboard. Data sent from a running process would exit a compute node to be transmitted on the network fabric. Each fabric connector may have a physical connection to a port on a network switch to facilitate the above-referenced data flow on the network fabric.

Referring now to the drawings, FIG. 1 illustrates an example set of connectors (i.e., a slot) working together to allow connection of an expansion card, such as a mezzanine expansion card. The connectors support connection of a mainboard to a network fabric through a mezzanine expansion card according to one or more disclosed implementations. FIG. 1 includes connector 1 (105) and connector 2 (110). In this example, connector 1 (105) and connector 2 (110) are mirror images of a same type of connector and positioned as rotated 180 degrees relative to each other when positioned on a mainboard. Connector 1 (105) has physical pin location 1 (106) at its upper left portion and pin numbers increase to 40 on the top with pin locations 41-80 being on the bottom of connector 1 (105) as illustrated. Connector 2 (110) has pin location 1 (111) at the lower right corner and pin location 80 at the upper right corner as labeled. Together these connectors 105, 110 may provide a slot, and thus a part of a communication bus (not otherwise shown), for a mezzanine expansion card to plug into a mainboard as described in more detail below. The mezzanine expansion card will plug into the mainboard using plug in connectors (not shown) that mate with the connectors 105, 110 of the mainboard.

Figure 2A:
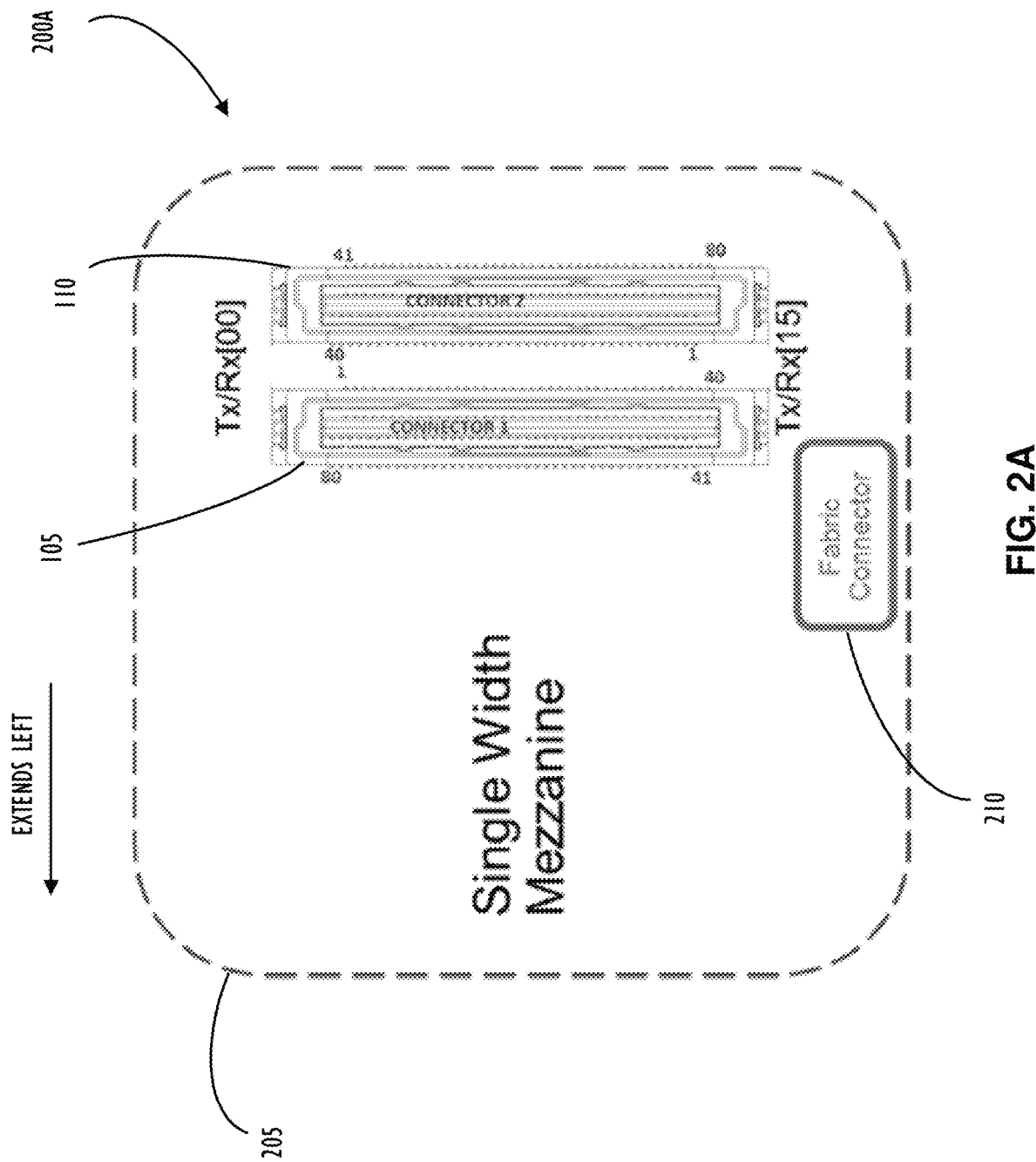
FIG. 2A illustrates a single width mezzanine that connects to a set of connectors in a first "normal" orientation, according to one or more disclosed implementations.

FIG. 2A illustrates a first "normal" orientation view 200A showing a single width mezzanine 205 that connects to a set of connectors (105 and 110 from FIG. 1), the set of connectors (105 and 110) in this example allow single width mezzanine 205 to provide a PCIe bus connection to support communication to a network fabric (not shown) via a fabric connector 210, according to one or more disclosed implementations. As illustrated in normal orientation view 200A, when single width mezzanine 205 is connected to the mainboard (not shown) single width mezzanine 205 will set above and over the set of connectors 105 and 110 and may extend laterally away from the set of connectors 105 and 110. In this example, single width mezzanine 205 extends more in a lateral direction to the left than any of the other three directions (up, down, and right). As discussed in more detail below, this type of offset overlap may make it desirable to allow single width mezzanine 205 to be plugged in as shown in normal orientation 200A or in a "reverse" orientation 200B of FIG. 2B where single width mezzanine is rotated 180 degrees clockwise.

Figure 2B:
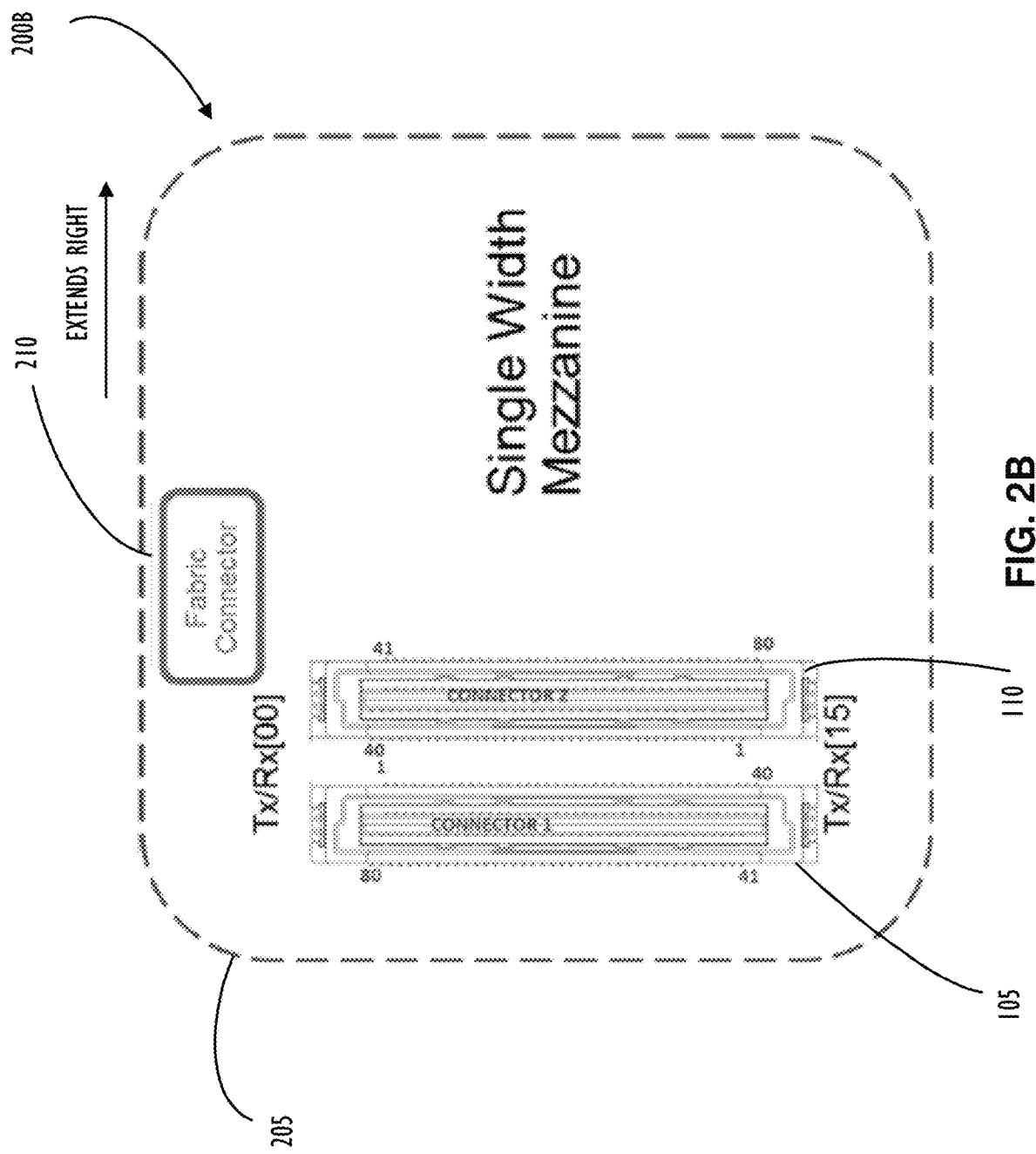
FIG. 2B illustrates the single width mezzanine of FIG. 2A connected in a second "reverse" orientation rotated at 180 degrees relative to the first orientation of FIG. 2A, according to one or more disclosed implementations.

For purposes of this disclosure, when a mezzanine expansion card is plugged in with an orientation that has no adaptation performed for plug in mappings, the mezzanine expansion card will be referenced as being inserted in its "normal" orientation (FIG. 2A). The orientation rotated 180 degrees from "normal" will be referred to as a "reverse" orientation (FIG. 2B). When in a reverse orientation, some form of translation (e.g., lane reversal for PCIe) or adjustment of pin mappings will be performed for the mezzanine expansion card. Multiple techniques of pin mappings may be performed either independently or together as explained throughout this disclosure. In some cases, multiple translations may be performed for a single expansion card, but it may be desirable (e.g., for performance reasons) to minimize the number of translations performed for a communication bus established between a mezzanine expansion card and processors in communication with that mezzanine expansion card via the communication bus.

Note that when rotated 180 degrees relative to view 200A, as in reverse orientation 200B, the physical electrical connections (i.e., pin connections) between single width mezzanine 205 and connectors 105 and 110 will also be to an adjacent connector (also rotated 180 degrees). Accordingly, disclosed techniques allow for automatic detection of the orientation of the connectors 105, 110 to allow for adjustment of data processing in a number of different manners (e.g., lane reversal, signal mapping, or a combination thereof as discussed herein below). Note also, that because of the respective relative orientations of connectors 110 and 105 the connection that was at pin 1 of connector 2 (110) will become pin 1 of connector 1 (105) (i.e., after rotation and insertion of single width mezzanine 205).

Other pinouts will similarly be switched to maintain their physical pin out number association. Put another way, single width mezzanine 205 is not physically keyed with respect to the set of connectors and may be inserted to extend physically to the left as in normal orientation 200A or may be inserted to extend physically to the right as in reverse orientation 200B. Similarly, as discussed in more detail below, a double width mezzanine (225 of FIG. 2C) may bridge across two sets of connectors at different points on a mainboard as shown in FIGS. 3D-3E. This bridging may result in individual connectors (there are two sets of individual connectors on a double width mezzanine) being inserted in either a reverse orientation or a normal orientation.

Allowing multiple connection orientation options in an automatically detectable manner may allow for end-users to configure input/output capacity for processors of a mainboard based on many different factors including price, switch port availability, load balancing across processors, etc. Further, adjustments to bandwidth allocation (e.g., input/output capacity per processor on a mainboard) may be made by adding more mezzanine expansion cards containing additional fabric connectors 210 or by repositioning existing cards in alternate layouts as desired. Examples of options and different configurations for throughput will be discussed further below.

Figure 2C:
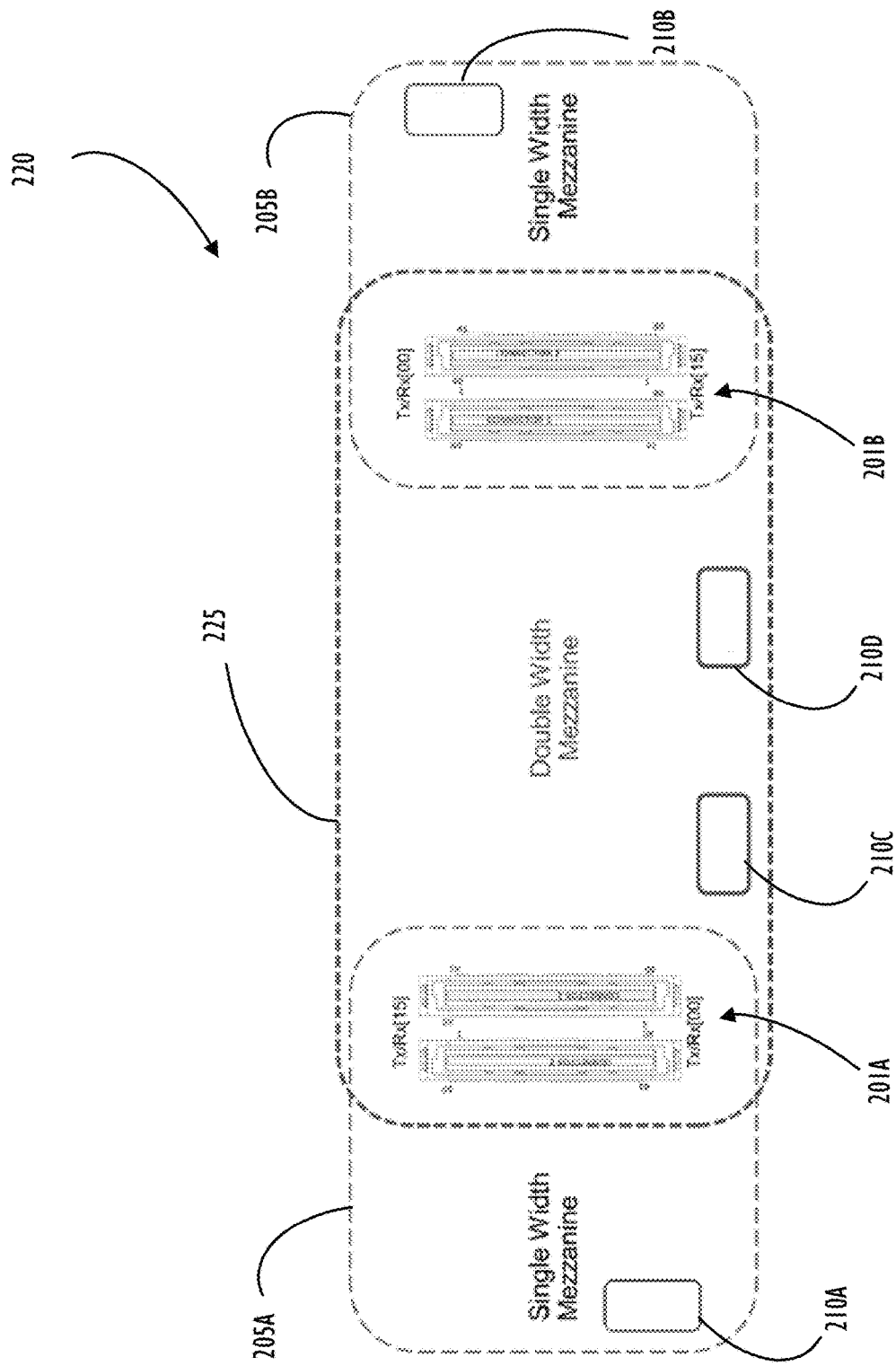
FIG. 2C illustrates two single width mezzanine expansion cards, each plugged into one of two different sets of connectors at an orientation opposite each other by 180 degrees (but each maintaining a "normal" orientation with respect to their respective connectors) and an alternative of one double width mezzanine expansion card using the two different sets of connectors simultaneously, according to one or more disclosed implementations.

FIG. 2C illustrates view 220 to show options of two single width mezzanine expansion cards 205A and 205B, respectively plugged into one of two different sets of connectors 201A and 201B at a normal orientation. Expansion card 205A includes fabric connector 210A and expansion card 205B includes fabric connector 210B. As explained throughout this disclosure, each of fabric connectors 210A-B may provide communication bandwidth to a network fabric for processors (not shown) communicatively coupled to a corresponding connector set (e.g., connector set 201A for expansion card 205A and connector set 201B for expansion card 205B).

As shown in view 220, single width mezzanine expansion card 205A is rotated with respect to mezzanine expansion card 205B by 180 degrees. However, because connector set 201A is reversed from connector set 201B (note location of TxRx[00] as labeled for each of connector set 201A and 201B) the orientation of each single width mezzanine expansion card 205A and 205B as illustrated results in a normal orientation with respect to pin out connections for their respective connector set.

As an alternative to that shown in view 220, one of single width mezzanine expansion cards 205A or 205B may be rotated 180 degrees to occupy the space shown in view 220 to be between connector set 201A and connector set 201B. This rotation may be desirable, for example, if the physical space occupied by other components or objects (not shown) would impede their insertion in normal orientation. According to disclosed techniques, physical rotation and insertion of either of single width mezzanine expansion cards 205A or 205B would result in a functional expansion card operating in an automatically detected (and adjusted for) reverse orientation.

FIG. 2C also illustrates in view 220 that an alternative of one double width mezzanine expansion card 225 may be utilized (if desired). In this case, double width mezzanine expansion card 225 would occupy connector set 201A and 201B simultaneously. Note that the dashed lines for the mezzanine expansion cards of view 220 are intended to represent an either/or configuration where a) either or both of the two single width mezzanines 205A and 205B may be used to provide fabric connection via fabric connector 210C and 210D for associated processors (discussed below with reference to FIGS. 3A-3F), or b) double width mezzanine 225 may be used. This restriction should be clear because only one mezzanine expansion card may be physically plugged into a set of connectors at a time.

The two fabric connectors 210C and 210D may provide double width mezzanine expansion card 225 with similar output capabilities (e.g., input/output bandwidth) as the combination of fabric connector 210A on single width mezzanine expansion card 205A and fabric connector 210B on single width mezzanine expansion card 205B. That is, if a single width mezzanine expansion card 205A, 205B is considered to have 100% bandwidth, double width mezzanine expansion card 225 may be considered to have 200% bandwidth.

Further, in some examples, single width mezzanine expansion card 205A would be associated with processors on a mainboard that are connected to connector set 201A while single width mezzanine expansion card 205B would be associated with processors on the mainboard that are connected to connector set 201B. In contrast, use of double width mezzanine expansion card 225 may represent a configuration where bandwidth allocation across associated processors may be different than having dedicated single width mezzanine expansion cards. This is, in part, because double width mezzanine expansion card 225 is concurrently connected to both of connector set 201A and 201B concurrently, whereas each single width mezzanine expansion card 205A and 205B would have an independent singular connection to the mainboard (not shown).

Specifically, it may be possible, for example, to allocate more than half of bandwidth available to double width mezzanine expansion card 225 (considered at 200% above) to a processor associated with one set of connectors (e.g., connector sets 201A and 201B). In this example, double width mezzanine expansion card 225 may be considered to have 200% of the bandwidth capacity of each single width mezzanine expansion card (e.g., expansion cards 205A and 205B). Allocation of 125% to processors associated with connector set 201A and 75% to processors associated with connector set 201B (total of 200%) is one example of uneven allocation of bandwidth that may be possible.

Figure 2D:
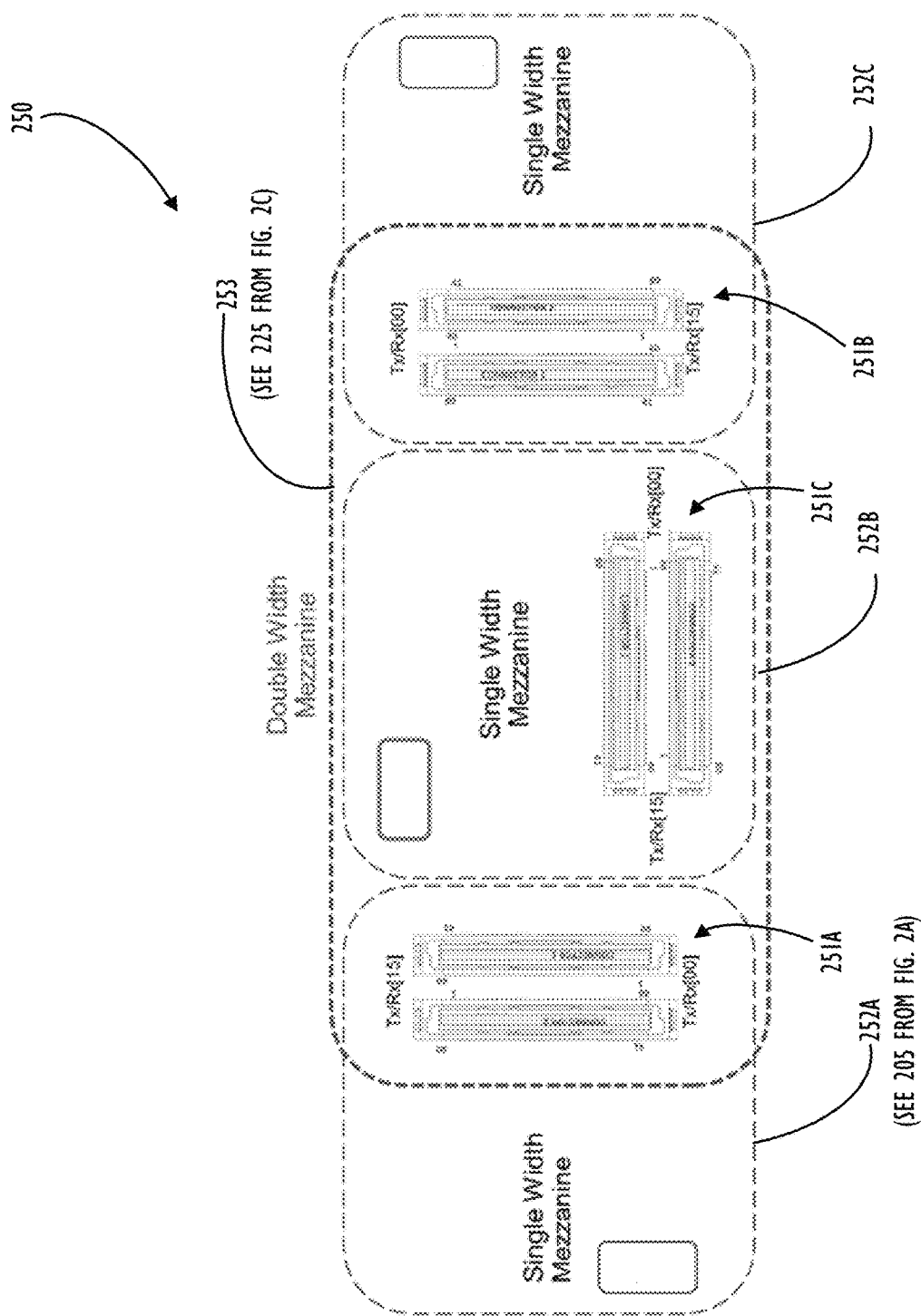
FIG. 2D extends the example of FIG. 2C to include a third set of connectors on the mainboard that may be used by a third single width mezzanine expansion card concurrently (the third set would be unused and physically obscured by the alternative use of one double width mezzanine), according to one or more disclosed implementations.

FIG. 2D extends the example of FIG. 2C to include a third set of connectors 215C on the mainboard (not shown), according to one or more disclosed implementations. The third set of connectors 215C may be used by a single width mezzanine expansion card 252B concurrently with another two single width mezzanine expansion cards 252A and 252C. Note that the third set 251C would be unused and physically obscured by the alternative use of one double width mezzanine 253. In some implementations, if different mezzanine expansion cards were implemented with different heights (e.g., in the Z direction), the underlying connectors may still be accessible and concurrently usable. Specifically, the physical obstruction limitations may be altered by altering heights of adjacent (or overlapping) mezzanine expansion cards.

Specifically, FIG. 2D illustrates a first single width mezzanine 252A connected to connector set 251A; a second single width mezzanine 252B (mentioned above connected to connector set 251C); and a third single width mezzanine 252C connected to connector set 251B. Thus, a mainboard having three sets of connectors in the same physical space allows for either three independent single width mezzanine expansion cards to be concurrently active or a single double width mezzanine expansion card (e.g., double width mezzanine expansion card 253) that occupies the same physical space. Accordingly, based on desired bandwidth a different number of mezzanine expansion cards may be used.

Figure 2E:
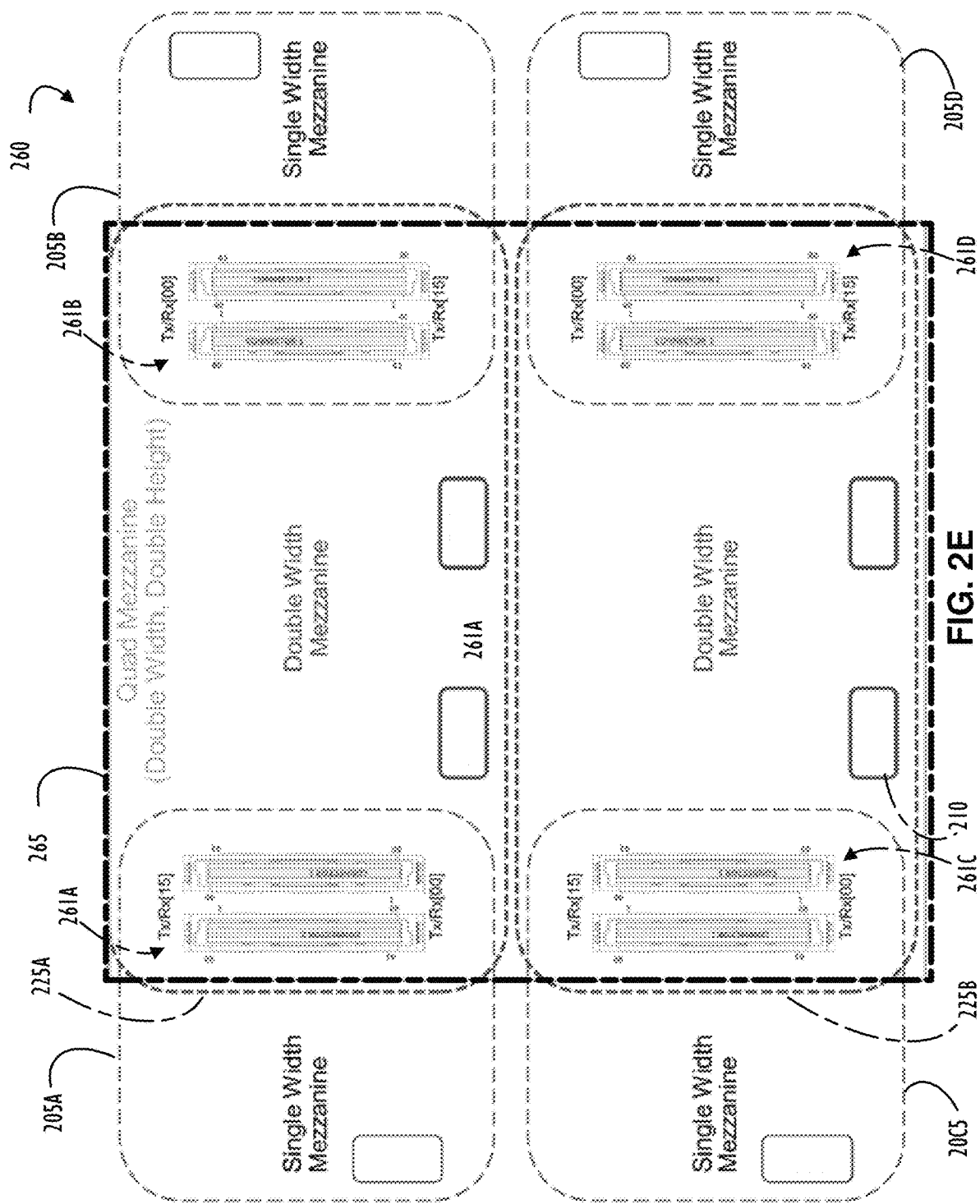
FIG. 2E extends the example of FIG. 2C to include four sets of connectors on the mainboard that may be used by a combination of single width mezzanine expansion cards (up to four in this example), up to two double width mezzanine expansion cards, or a single quad mezzanine that would connect to all four sets of connectors, according to one or more disclosed implementations.

FIG. 2E extends upon the example of FIG. 2C to include, in view 260, four sets of connectors on the mainboard (not shown) that may be used by a combination of single width mezzanine expansion cards 205A-D (up to four in this example), up to two double width mezzanine expansion cards 225A-B, or a single quad mezzanine 265 that would simultaneously connect to all four sets of connectors 215A-D, according to one or more disclosed implementations. Additionally, a combination of two single width mezzanine expansion cards (e.g., single width mezzanine expansion cards 205A-B) may be used concurrently with a single double width mezzanine expansion card (e.g., double width mezzanine expansion card 225B). Other combinations are also possible that may be limited only by physical space constraints.

As illustrated in each of the FIGS. 2A-E, each instance of a mezzanine expansion card may be plugged into a corresponding connector set (or group of connector sets) in at least two orientations. That is, a) each instance of a single width mezzanine expansion card may be rotated 180 degrees and re-inserted into the same set of connectors (slot); b) each instance of a double width mezzanine expansion card may be rotated 180 degrees and have the pinouts "repositioned" into an opposite set of connectors; and quad mezzanine expansion card 265 may be rotated 180 degrees and have pinouts "repositioned" in a similar manner (i.e., pinouts connected to connector set 261D would be repositioned to plug into connector set 261A). Because automatic detection techniques allow for this type of flexibility for orientation and card combinations, a user may have increased simplicity and increased use of combinations of components over previously available expansion cards.

Referring collectively now to FIGS. 3A-F, different examples of associations between flexible I/O mezzanine expansion cards (e.g., single width mezzanine expansion cards 305A-D, double width mezzanine expansion cards 306A-B) and processing units (e.g., 331A-E of FIG. 3B) of a mainboard (e.g., 340 of FIG. 3C and 350 of FIGS. 3D-F) are illustrated, according to one or more disclosed implementations.

Figure 3A:
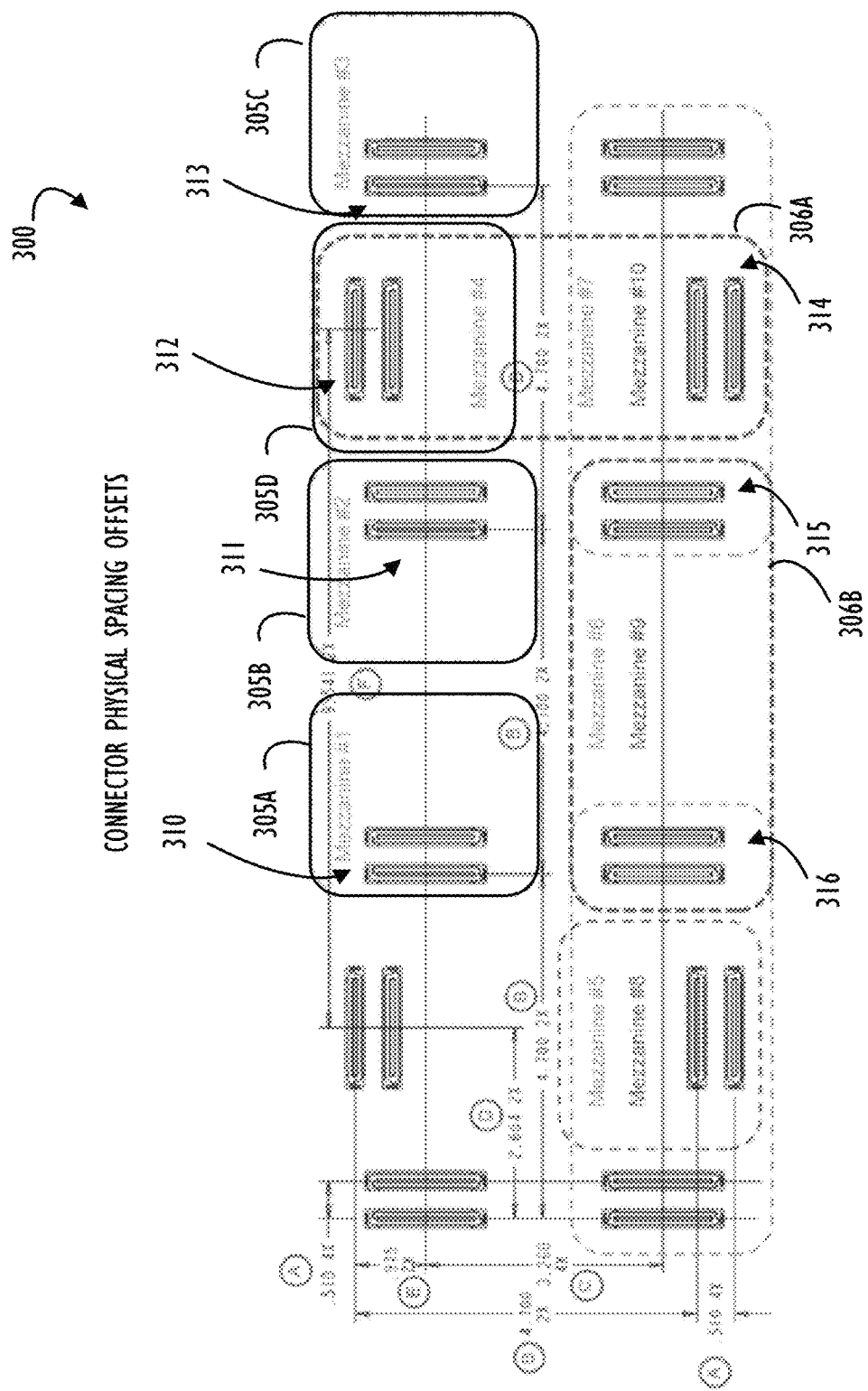
FIG. 3A illustrates an example of connector physical space offsets on a mainboard to allow different combinations and permutations of sets of mezzanine expansion cards to be plugged in simultaneously, according to one or more disclosed implementations.

Beginning with FIG. 3A, view 300 illustrates one possible example of connector physical spacing offsets. As explained above, different combinations and permutations of concurrently usable mezzanine expansion cards may be limited by physical constraints. Accordingly, positioning, orientation, and spacing between connector sets on a mainboard may allow for additional flexibility at reduced cost. View 300 illustrates only a single example of spacing considerations that may be considered. As illustrated, it should be clear that size constraints of the expansion cards themselves as well as supported orientations may be factors to be considered when placing connectors (or connector sets as shown) on a mainboard.

FIG. 3A is not drawn to exact scale but is intended for illustrative purposes only. Specifically, the spacing between connector set 312 and connector set 314 may be identical to the spacing between connector set 316 and connector set 315 such that double width mezzanine expansion card 306A is interchangeable with double width mezzanine expansion card 306B. Additionally, each of single width mezzanine cards 305A-D may have an identical form factor and be interchangeable with each other.

As illustrated in view 300, multiple instances of single width mezzanine expansion cards (e.g., 305A-D) may be implemented (e.g., plugged in) concurrently with multiple instances of double width mezzanine expansion cards (e.g., 306A-B). Further, view 300 illustrates that orientations of different instances may not be consistent with each other. Specifically, double width mezzanine expansion card 306A is illustrated to plug into both of connector set 314 and 312 and mezzanine expansion card 306A is illustrated as a dashed line. Thus, mezzanine expansion card 306A is illustrated to be plugged in having a vertical orientation (rotated 90 degrees relative to double width mezzanine expansion card 306B) and represents an alternative to having single width mezzanine expansion card 305D.

Additionally, single width mezzanine expansion cards 305A-D may be plugged in at different orientation relative to each other. These different relative orientations may be either considered a normal orientation or a reverse orientation depending on pin out numberings (not shown but see FIGS. 2A-B) for their respective connector sets. In any case, disclosed techniques allow for identical mezzanine expansion cards (of any width) to be plugged into a set of connectors (or multiple sets of connectors) in a variety of ways. Accordingly, disclosed techniques allow for possible re-use of expansion cards by a customer as they alter available throughput capacity (e.g., alter number of fabric connections and available bandwidth) for processors (not shown) associated with a mainboard. These concepts will be explained further below by way of additional examples.

Figure 3B:
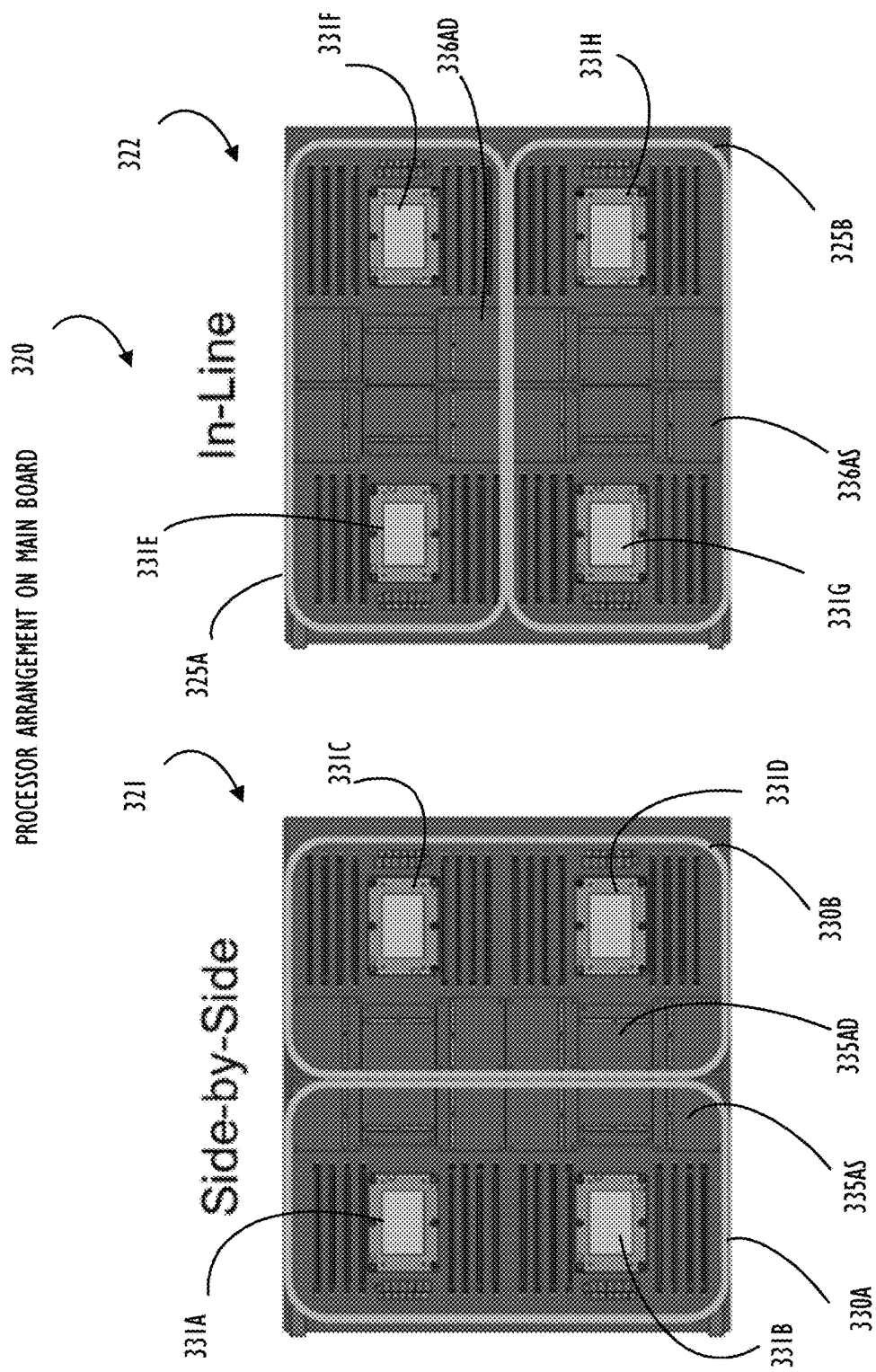
FIG. 3B illustrates alternative processor arrangements on a mainboard, according to one or more disclosed implementations.
Figure 3D:
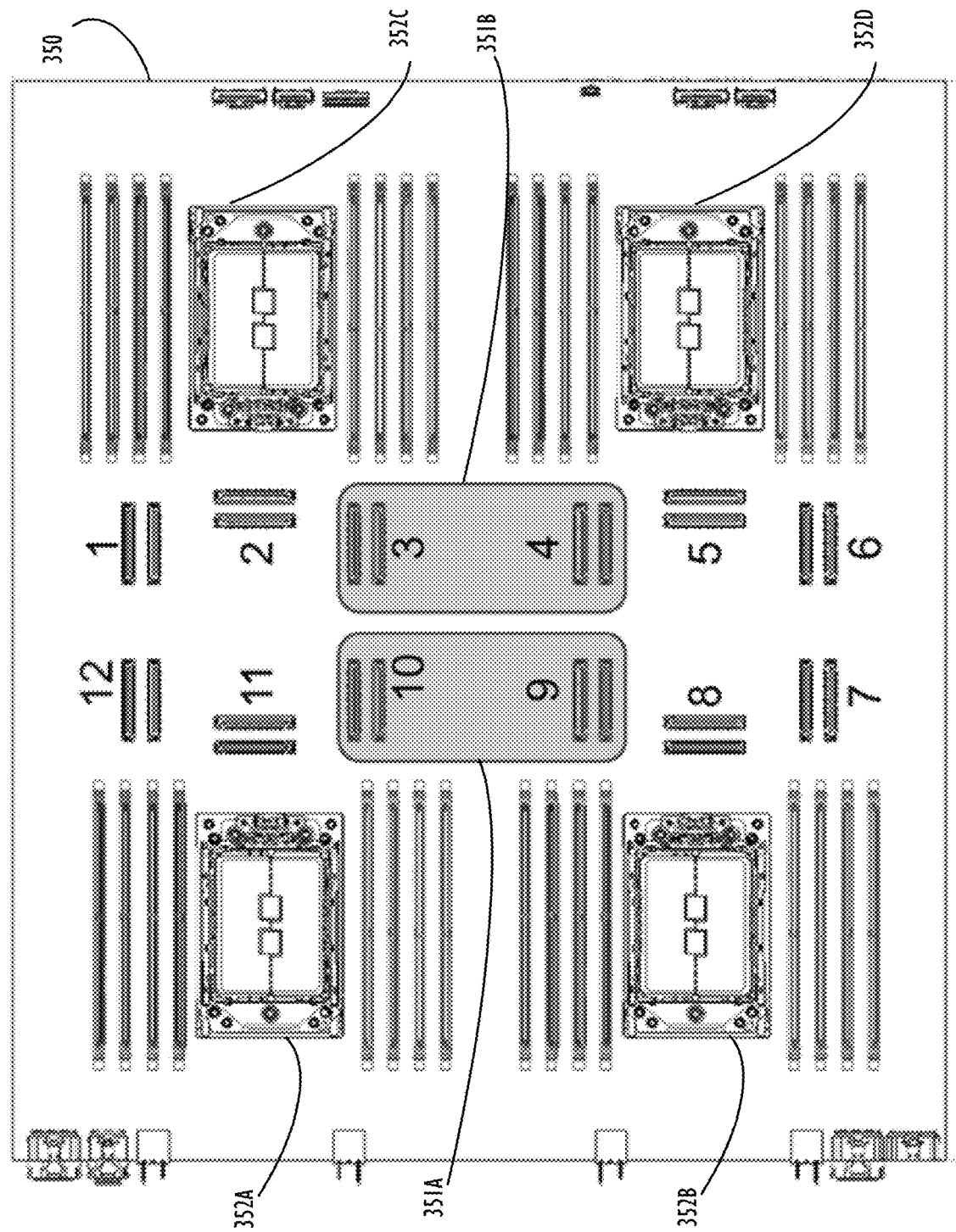
FIG. 3D illustrates two double width mezzanine expansion cards with each of the two double width mezzanine expansion cards spanning two different processing units on a mainboard, according to one or more disclosed implementations.
Figure 3E:
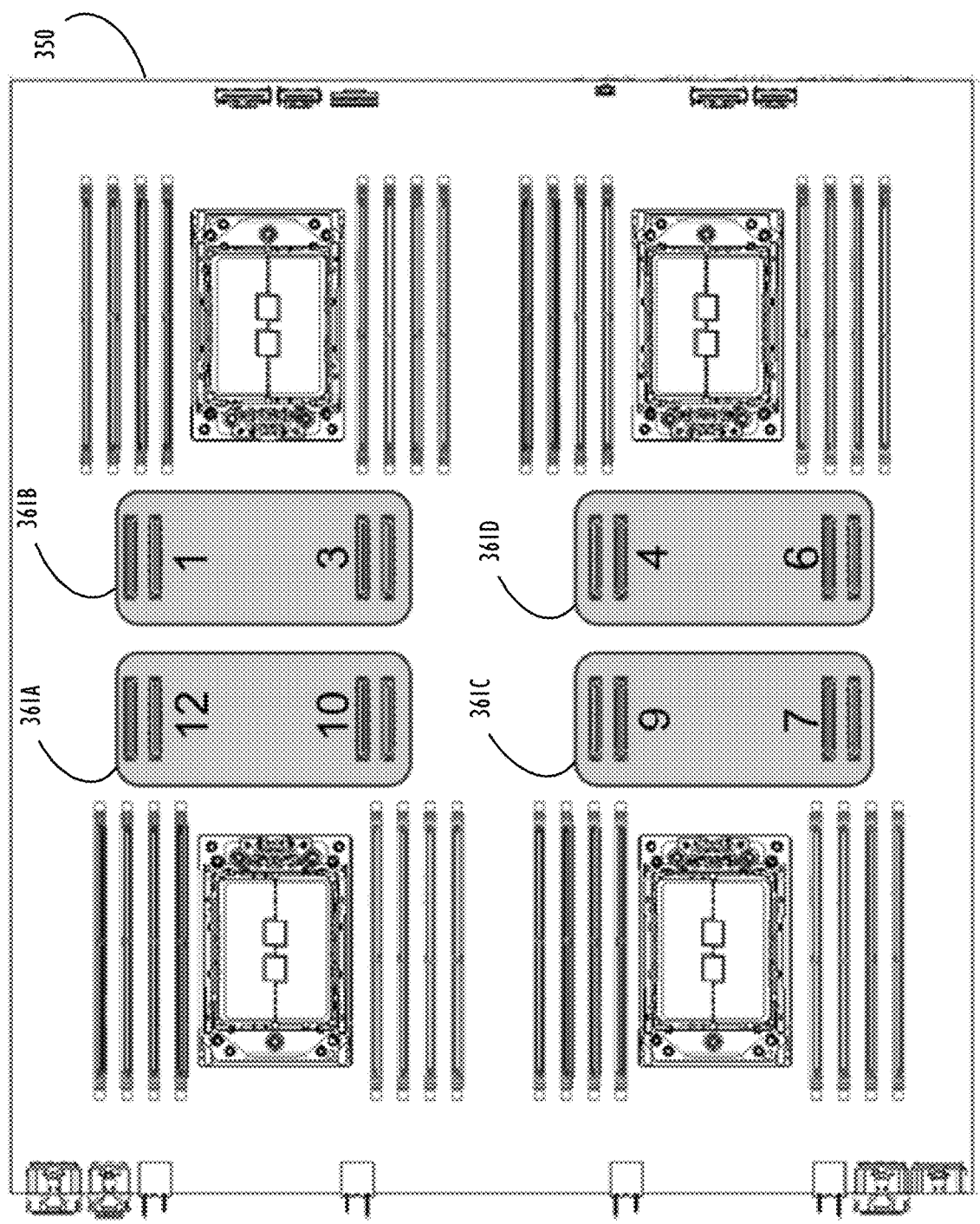
FIG. 3E illustrates four double width mezzanine expansion cards with each of the four double width mezzanine expansion cards associated with an individual processing unit, according to one or more disclosed implementations.

Referring now to FIG. 3B, view 320 illustrates a side-by-side processor orientation on mainboard 321 and an alternative in-line processor orientation on mainboard 322. In the side-by-side orientation illustrated for mainboard 321, two (vertically in this illustration) CPUs, namely CPU 331A and CPU 331B form a single node as identified on mainboard 321 by oval 330A (note that oval 330A is for illustrative purposes only and provides no functionality on mainboard 321). Similarly, CPU 331C and CPU 331D form a second node on the mainboard 321 as indicated by oval 330B. Single width mezzanine 335AS, in this example, is illustrated to be providing I/O bandwidth for only CPU 331B. In contrast, double width mezzanine 335AD is illustrated to span across both of the nodes (i.e., as indicated by ovals 330A and 330B) of mainboard 321. As explained throughout this disclosure, multiple configurations are possible where I/O bandwidth is shared from a single mezzanine expansion card across multiple CPUs of a single node or multiple CPUs on different nodes. Many different implementations are possible to provide for flexible bandwidth allocation (e.g., based on run-time configuration parameters).

In-line processor orientation is illustrated for mainboard 322 in view 320. In this example, oval 325A and oval 325B illustrate that mainboard 322 is configured to provide a multiple CPU node relative to a horizontal orientation (as illustrated). Having a mainboard with either side-by-side orientation or in-line orientation is a design consideration for the mainboard manufacturer. Disclosed implementations of mezzanine expansion cards may be capable of working with either orientation automatically. In the in-line orientation of mainboard 322 the first node identified by oval 325A includes CPU 331E and CPU 331F.

The second node of mainboard 322 (identified by oval 325B) includes CPU 331G and CPU 331H. Single width mezzanine 336AS is illustrated to be associated with CPU 331G in this example. Double width mezzanine 336AD is illustrated to bridge across each of the two nodes provided on mainboard 322 and is associated with CPU 331F and CPU 331H. As explained throughout this disclosure, flexible I/O mezzanine expansion cards implemented with disclosed techniques may be utilized in numerous orientations and configurations to a) provide shared I/O bandwidth across nodes of a mainboard (e.g., a node of a mainboard may be considered a server in a computer network); or b) provide shared I/O bandwidth across CPUs of a single node. Many different configurations are possible and different load allocation techniques may be used to allocate bandwidth of I/O provided by a mezzanine expansion card to associated CPUs.

As explained above, a double width mezzanine expansion card may provide for uneven allocation to associated processors but may also provide an even allocation. If an even allocation is provided, use of a double width mezzanine expansion card may be functionally equivalent (but not necessarily cost equivalent) to two single width mezzanine expansion cards.

Referring now to both FIG. 3B and FIG. 3C, double width mezzanine 336AD would connect to mezzanine connectors 3 and 4 as illustrated in more detail on mainboard 340. Additionally, double width mezzanine 335AD would connect to mezzanine connectors 5 and 8 as illustrated in more detail on mainboard 340.

Continuing with FIG. 3C, mainboard 340 is illustrated to support two functionally independent nodes (When referencing I/O capabilities as in this disclosure, nodes may be interchangeably called servers. To further illustrate this point, the term server is used in this example). Each of first server 341 and second server 342 have two processing units (labeled for each server as CPU 1 and CPU 2). As illustrated in FIG. 3C, each server has a total of 6 single width mezzanine expansion cards numbered 1-12 in FIG. 3C. First server 341 may be connected to a network fabric (not shown) by the available fabric connectors (not shown) across single width mezzanine expansion cards 1-6. Second server 342 may be connected to the same or a different network fabric (also not shown) by the available fabric connectors (not shown) across single width mezzanine expansion cards 7-12. Note that some of the single width mezzanine expansion cares 1-12 may be removed and their removal may result in a reduced maximum network bandwidth for their corresponding processors.

In the example of FIG. 3C, the association of connector sets and processors may depend on actual wiring of mainboard 340 (actual wiring not shown), but for illustrative purposes it may be considered that: connector sets associated with single width mezzanine expansion cards 1-3 are associated with CPU 1 of first server 341; connector sets associated with single width mezzanine expansion cards 4-6 are associated with CPU 2 of first server 341; connector sets associated with single width mezzanine expansion cards 7-9 are associated with CPU 1 of second server 342; and connector sets associated with single width mezzanine expansion cards 10-12 are associated with CPU 2 of second server 342.

Referring now to FIG. 3D, mainboard 350 is illustrated to have four processors 352A-D (e.g., CPUs). Relative to FIG. 3C, the single width mezzanines have been removed and connector set numbering 1-12 has been retained. Instead of multiple single width mezzanines as were shown in FIG. 3C, FIG. 3D illustrates that four processors 352A-D may be supported with only two double width mezzanine expansion cards. Specifically, (assuming a side-by-side processor orientation as in FIG. 3C) double width mezzanine expansion card 351A is illustrated to support each of processor 352A and processor 352B concurrently (via connector sets 9 and 10) and double width mezzanine expansion card 351B is illustrated to support each of processor 352C and processor 352D (via connector sets 3 and 4) concurrently.

Referring now to FIG. 3E, mainboard 350 is again illustrated but a different set of double width mezzanine expansion cards are shown in a different possible configuration. Note that mezzanine expansion cards may be inserted in a normal or reversed orientation without altering their expected functionality for any of the different configurations illustrated in this disclosure. Limitations of connection may be caused by physical obstruction as automatic adjustment may be made for either normal or reversed connection orientation.

As illustrated in FIG. 3E, four double width mezzanine expansion cards 361A-D are illustrated. Assuming the above referenced illustrative processor to connector set associations are maintained, each instance of a double width mezzanine expansion card is associated with a single processor on mainboard 350. Accordingly, FIG. 3E may represent an adjustment to the configuration shown in FIG. 3D to double the available I/O bandwidth for each associated processor. The alteration provided by a customer to double I/O bandwidth from the example of FIG. 3D to that of FIG. 3E, in this example, corresponds to an increase in physical hardware of only two double width expansion cards (relative to that of FIG. 3D). Thus, a customer may only have to purchase (or re-allocate) two double width expansion cards to recognize a doubling of I/O bandwidth available to both server 1 (341) and server 2 (342) (as illustrated in FIG. 3C). In an alternative not specifically illustrated, a customer may elect to purchase and install only 1 additional double width mezzanine expansion card to double the available I/O bandwidth of either server 1 (341) or server 2 (342) while leaving the available I/O bandwidth of the other the same. Many combinations are possible given the flexibility of disclosed techniques for interchangeable mezzanine expansion cards and reduction of restrictions as to orientation positions for those mezzanine expansion cards.

Figure 3F:
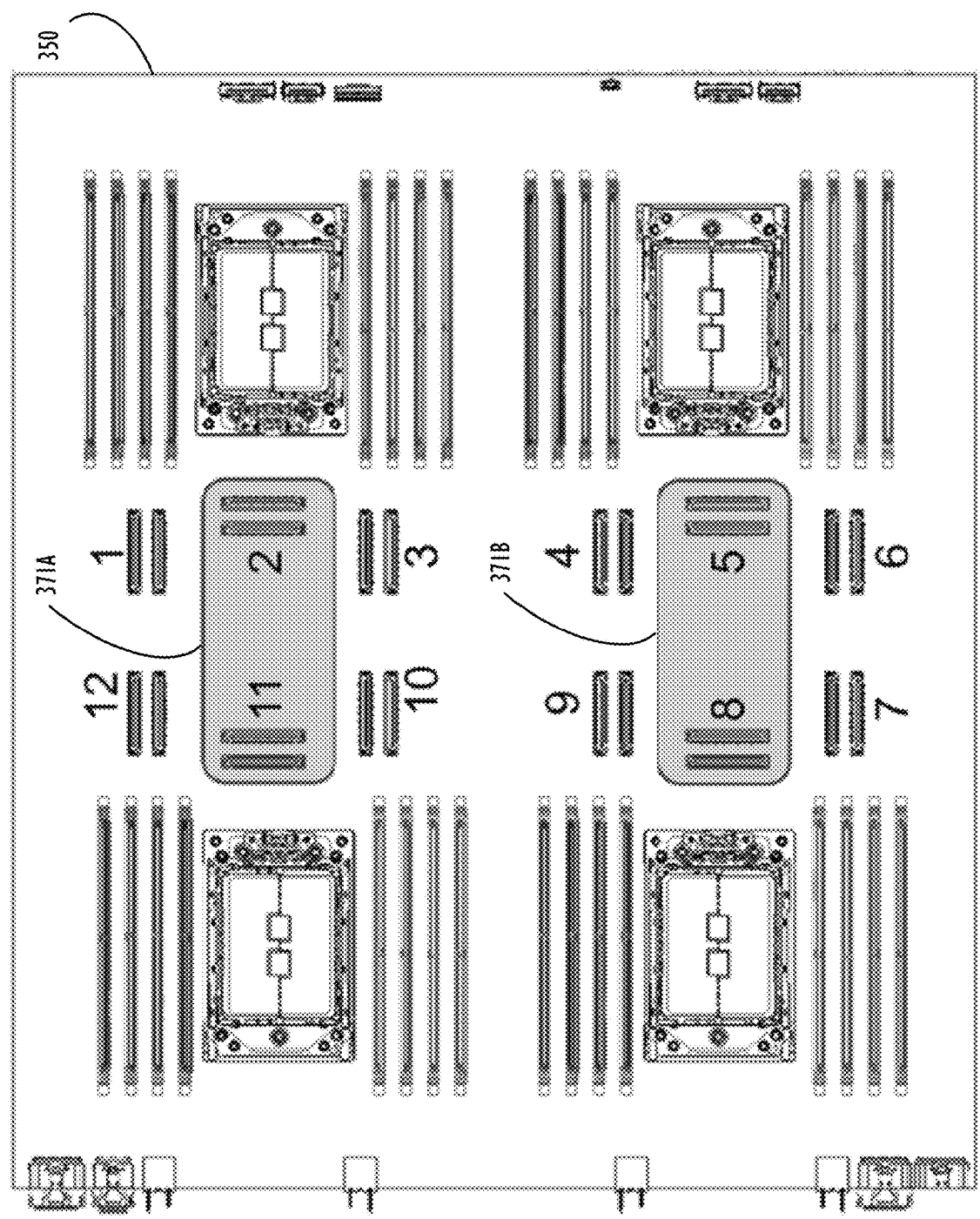
FIG. 3F illustrates a variation of FIG. 3D where two double width mezzanine expansion cards each span two different processing units for an alternative configuration, according to one or more disclosed implementations.

Referring now to FIG. 3F, an additional alternative to that of FIG. 3D is illustrated. In this example, mainboard 350 may be considered to have an in-line processor design or may be considered to have four processing units (CPUs) for a single server. In any case, a first double width mezzanine expansion card 371A is illustrated in a horizontal orientation to bridge across connector sets 11 and 12. A second double width mezzanine expansion card 371B is illustrated in a horizontal orientation to bridge across connector sets 8 and 5. In a first alternative to FIG. 3F not shown, but in keeping with the examples of this disclosure, double width mezzanine expansion card 371B could be rotated 90 degrees and inserted into connector sets 9 and 7 and an additional double width mezzanine expansion card (not shown) could be inserted into connector sets 4 and 5. In a second alternative to FIG. 3F not shown, double width mezzanine expansion card 371B could again be rotated 90 degrees and inserted into connector sets 9 and 7 and an additional single width mezzanine expansion card (not shown) could be inserted into any one of connector sets 4, 5, or 6. It should be clear that each of these alternatives not shown represent a reallocation of maximum available bandwidth for CPUs associated with connector sets, with minimal additional hardware components, to provide flexible I/O solutions in accordance with this disclosure.

Figure 4A:
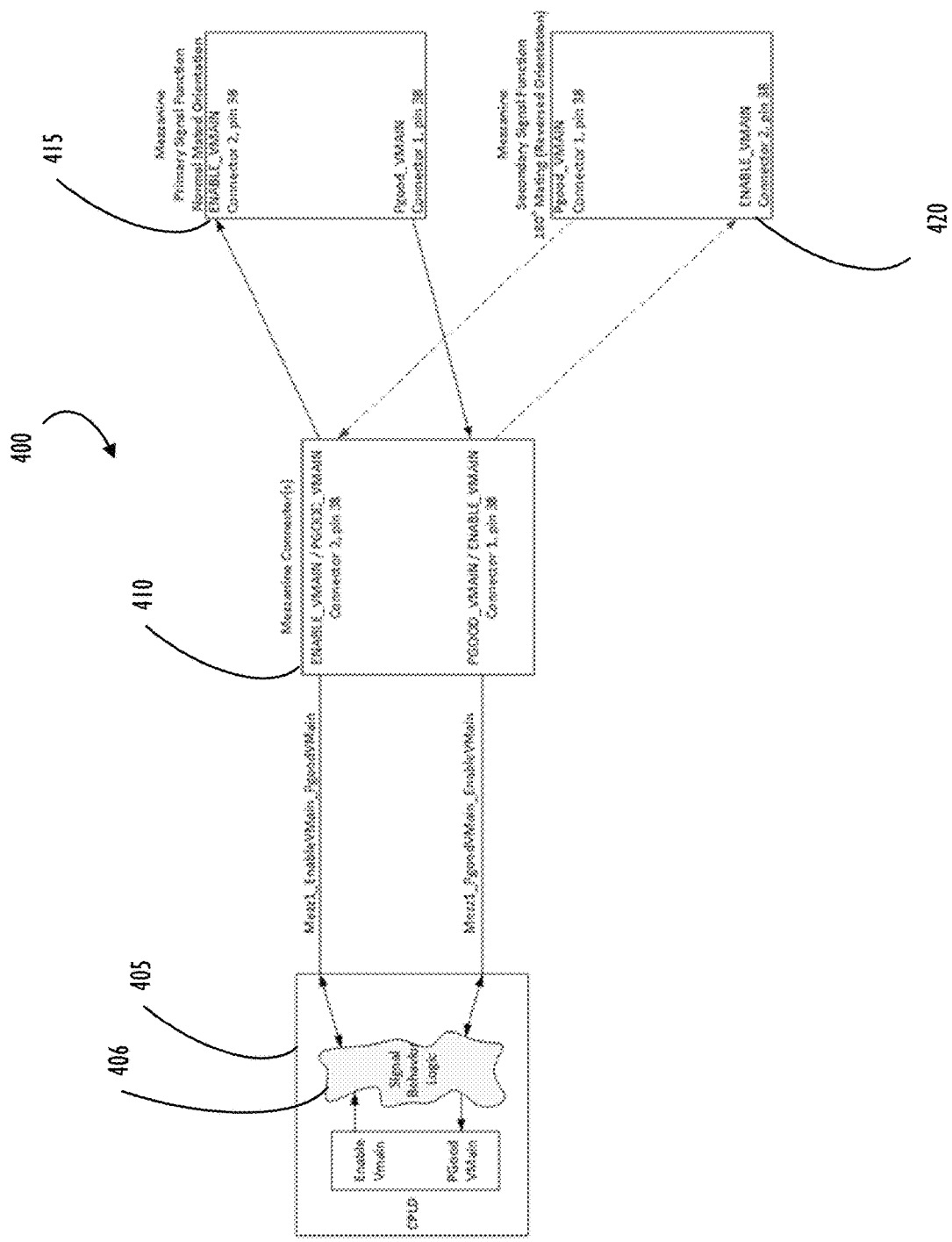
FIG. 4A illustrates an example of control and signal logic to adapt to different orientations of connection (e.g., plugging in) of mezzanine expansion cards, according to one or more disclosed implementations.

Referring now to FIG. 4A, view 400 illustrates a block diagram of possible signal adjustments that may be made to allow plug in (insertion) of a mezzanine expansion card, such as a flexible I/O mezzanine expansion card discussed above, without regard to orientation of the physical card. That is, there are several techniques that may be made to alter the signals of a communication bus to allow for adaptation based on a detected orientation of a physically unkeyed (i.e., not physically keyed for a single insertion orientation) expansion card.

To allow for an expansion card to be plugged into one or more connectors or connector sets (e.g., on a mainboard) in multiple orientations, one or more adjustment techniques may be used. In some cases, multiple adjustment techniques may be applied concurrently and some of the multiple adjustment techniques may have a net effect of no adjustment. That is, if two of the three disclosed adjustment techniques were to be in operation concurrently, the result of normal processing of a data path may be a result. Alternatively, if all three were applied concurrently, the result would appear as a single adjustment causing reversal of the data path.

In some implementations, it may be desirable to minimize the number of concurrent adjustments. In other implementations, the amount of processing for having multiple adjustments performed concurrently may be low enough that other factors may supersede the desire to minimize the number of concurrent adjustments. In all cases, the net result of disclosed techniques allow flexibility to an end-user with respect to plug in orientation of a given flexible I/O mezzanine expansion card.

View 400 will be discussed from left to right but each functional block of view 400 represents a portion of an adjustment that may be used as part of an implementation other than the complete implementation shown in view 400. That is, view 400 illustrates three sets of component functionality that may work together (e.g., as illustrated) or work with other variants (not shown) of functionality for one or more of the components.

Beginning at block 405, signal behavior logic 406 is illustrated as a possible adjustment phase for information being provided on a data bus. In this example, the outbound signals of the signal behavior logic 406 are illustrated as arriving at mezzanine connectors 410. Mezzanine connectors 410 represent a set of connectors such as connectors 105 and 110 of FIG. 1. Mezzanine connectors 410 may, in operation, receive a connection from a mezzanine expansion card plugged in for a normal orientation 415 or a reverse orientation 420.

Upon detection of an orientation of a mezzanine card, the signal logic behavior 406 may work in conjunction with mezzanine connectors 410 to provide the ENABLE_V-MAIN signal to connector 2, pin 38 of the mezzanine card (not otherwise shown) regardless of the plug in orientation of that mezzanine expansion card. Specifically, if a mezzanine expansion card is plugged in at a normal orientation, connector 2, pin 38 of mezzanine connectors 410 is provided to connector 2, pin 38 of the mezzanine expansion card (see 415). Alternatively, if a mezzanine card is plugged in at a reverse orientation, connector 2 pin 38 of mezzanine connectors 410 is provided to connector 1, pin 38 of the mezzanine expansion card (note connector 2 on mainboard is mapped to connector 1 on mezzanine expansion card for a reverse orientation).

This translation of mapping to alternate connectors is provided, in this example, by mapping alterations of signal behavior logic 406 such that signals arriving at the mezzanine expansion card have already been adjusted for the detected orientation of the mezzanine expansion card. Thus, for this example, no processing for adjustment is to be performed on the mezzanine expansion card itself. From the perspective of the mezzanine expansion card, for this specific example, there may be no awareness that the mezzanine expansion card is inserted in the reverse orientation.

Figure 4B:
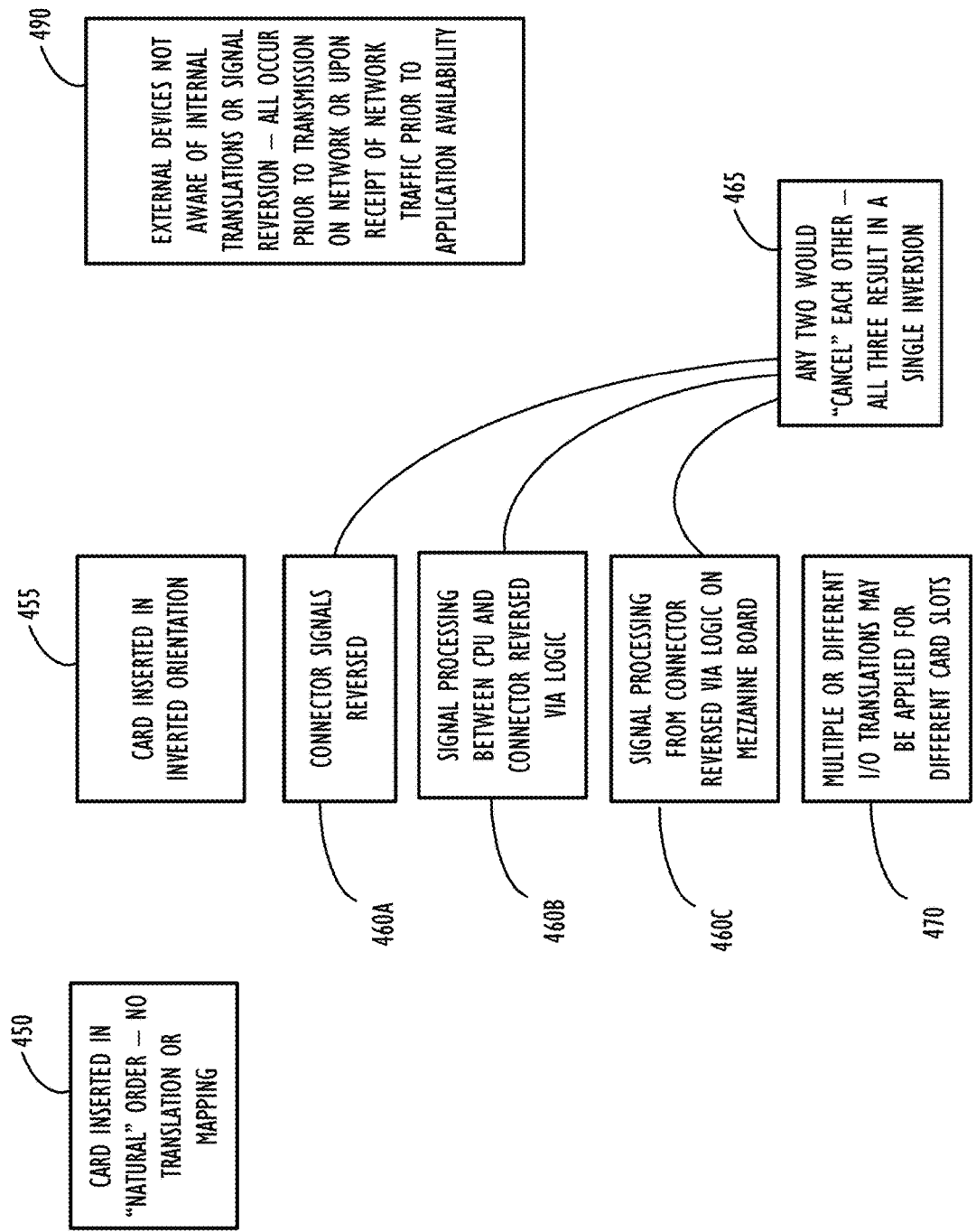
FIG. 4B illustrates different possible run-time adjustments and considerations for different implementations of flexible orientation of connection of a mezzanine expansion card, according to one or more disclosed implementations.

Referring now to FIG. 4B, a simplified block diagram is used to discuss different optional signal adjustments that are possible for the different implementations of disclosed techniques to allow multiple orientations of mezzanine expansion cards. Block 450 indicates that a mezzanine expansion card may be inserted into a mainboard in a normal (e.g., natural order) orientation and no translation or mapping of signals may be provided.

Alternatively, to normal processing, block 455 indicates that a mezzanine expansion card may be inserted into the same mainboard but be in a reverse orientation (e.g., may be rotated 180 degrees relative to normal). In this reversed insertion case that results in a reverse orientation, 1) the connector signals may be reversed (block 460A), 2) the signal processing between an associated CPU and a connector may be reversed via logic (e.g., lane-reversal ability of PCI bus where each lane of the bus is logically reversed automatically as part of the protocol); and 3) the signal processing between the connector and processors on the mezzanine expansion card may be reversed via logic (e.g., lane-reversal or some other software may perform the logical reversal).

Block 465 indicates that any two of the three techniques of 460A-C would "cancel" each other out, in part, because the signals would be reversed twice resulting ultimately in no reversal at all. Block 470 indicates that multiple or different I/O translations (e.g., adjustments via reversal) may be applied for different slots on a single mainboard concurrently. That is, a mainboard may concurrently support multiple mezzanine expansion cards plugged into a number of different connector sets and may perform a different translation (or set of translations) for each communication bus formed through an individual connector set.

Figure 5:
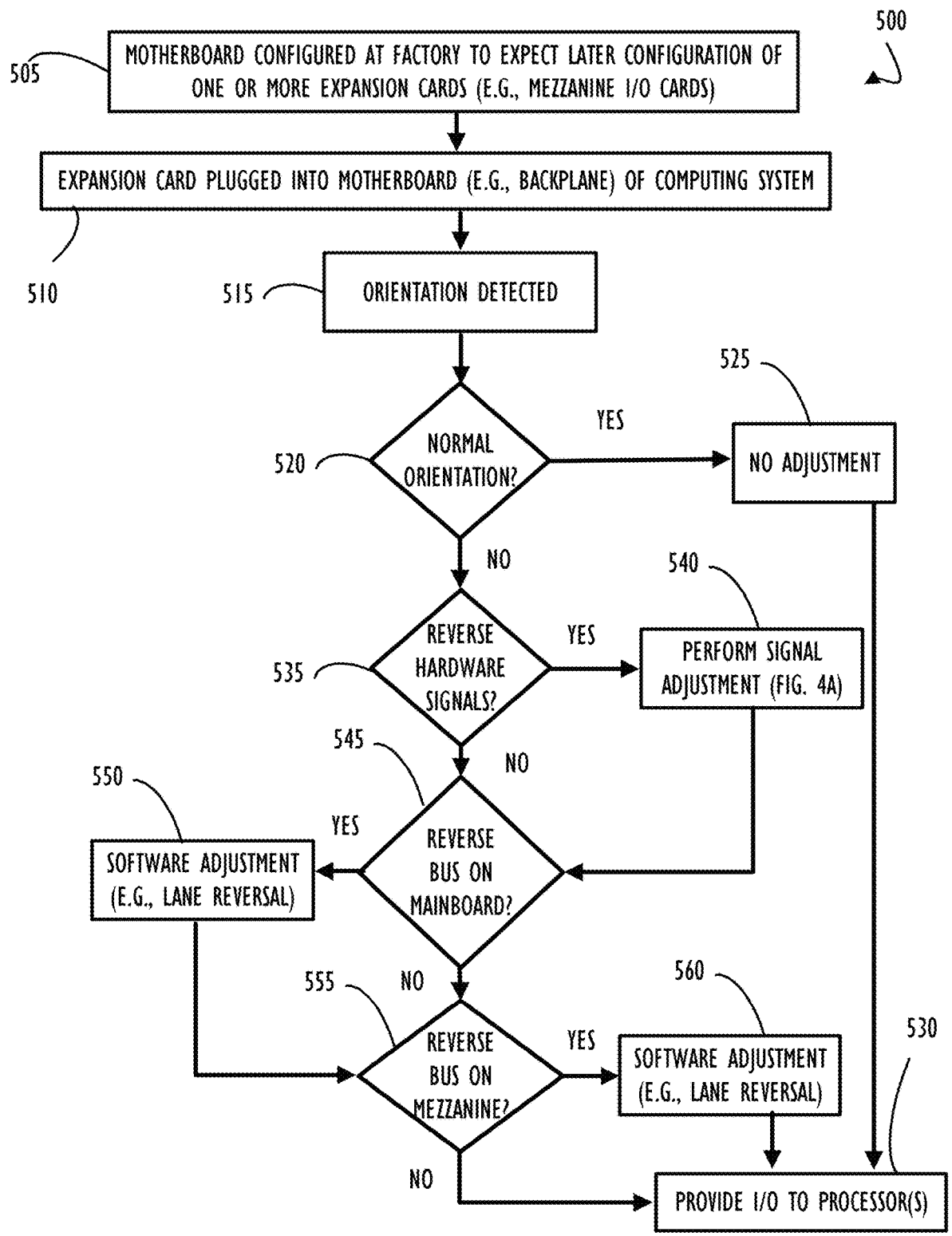
FIG. 5 illustrates a method of determination and processing for communication between one or more processors and one or more mezzanine expansion cards, according to one or more disclosed implementations.

Referring now to FIG. 5, shown is an example a method 500 that may be implemented by executing instructions on a processing device to determine orientation and implement bus communication capability based on the determined orientation. For example, such that a mezzanine expansion I/O card may be plugged into a mainboard of a processing device without regard as to an orientation of that mezzanine I/O card. Multiple mezzanine expansion I/O cards may be plugged into the same mainboard at different orientations from each other and may function without regard as to their respective orientations. As described herein, the lack of regard as to orientation may be from a customer viewpoint because method 500 will allow for different computer components to automatically adjust communication busses such that proper communication (from the perspective of application layer processing) is provided via each communication bus.

Example method 500 may be implemented by a combination of software, firmware, and/or hardware logic. Specifically, one example implementation may utilize hardware logic to implement a technique to reverse hardware signals on a mainboard between a processing unit and a connector. Additionally, implementations that use lane reversal techniques associated with a communication bus (e.g., PCI) may include software components to effect the translation of signals (e.g., reversal).

Method 500 begins at block 505 where a mainboard (sometimes referred to as a motherboard or a backplane) may be configured at a factory to expect later configuration of one or more expansion cards. For example, the expansion cards may include one or more mezzanine expansion cards for network fabric I/O as discussed herein. Block 510 indicates that an expansion card is plugged in (i.e., inserted) into a mainboard of a computing system. Block 515 indicates that an orientation detection may take place.

In one example, an orientation detection may take place by an interaction between the mainboard and the expansion card to detect which pinout signals are connected to different pins at the interconnection points between the mainboard and the expansion card. For example, processing logic associated with a mainboard may send pre-determined signals to the connector to determine which pinouts of the expansion card are connected and thereby determine an orientation of the expansion card. Similarly, logic on an expansion card may be able to detect how pins of the expansion card are inserted into a connector of a mainboard. In short, either the mainboard and/or the mezzanine card may, upon initial connection, execute an initialization portion of logic to determine (and possibly broadcast) an orientation of insertion (i.e., either normal or reverse). Decision 520 indicates that this determination may result in a normal orientation being detected to cause flow through the YES prong of decision 520 to block 525. At block 525, it may be determined that no adjustment of bus communication is to be implemented and flow may continue to block 530 where the expansion card may begin to provide I/O capability to one or more associated processor(s).

However, if at decision 520 it is determined that there is not "normal" orientation, then the reverse orientation logic may be invoked. Decision 535 indicates that in some implementations the hardware signals may be reversed (see FIG. 4A). If so, the YES prong of decision 535, flow continues to block 540 to implement hardware signal adjustment. If not, the NO prong of decision 535, then hardware signal adjustment may be bypassed. In either case, flow then continues, in this example, to decision 545 where a determination may be made to reverse signals locally on the mainboard. If so, the YES prong of decision 545, flow continues to block 550 where a software assisted adjustment may be implemented locally on the mainboard (e.g., PCI lane reversal) so that signals between processors and the connector(s) to the expansion card have their communication bus translated based on a reverse orientation. If not, the NO prong of decision 545, then local reversal on mainboard may be skipped. In either case, flow then continues to decision 555 where a determination may be made to reverse signals locally on the expansion card (e.g., between the connector pins and the processors of the expansion card). If so, the YES prong of decision 555, flow continues to block 560 where a software assisted adjustment may be implemented locally on the expansion card. If not, the NO prong of decision 555, software assisted local reversal on the expansion card may be skipped. In either case, flow then continues to block 530 (mentioned above) where the expansion card may begin to provide I/O capability to one or more associated processor(s).

As mentioned above, method 500 is only one example and each of the decisions and flows exiting decision points may be altered for different implementations. In some implementations, multiple translations may be implemented concurrently, and different reasons may exist to cause more than one translation to be implemented. In one hypothetical example, if a processor is already communicating with two expansion cards that each have an established hardware signal reversal (block 535) implemented on the mainboard, it may be desirable to implement hardware signal reversal for a third expansion card that is added to communicate with this same processor. Accordingly, for this hypothetical example, if the third expansion card is plugged in at a normal orientation, invoking reversal on the expansion card (block 560) in addition to implementing signal reversal (block 540) would maintain consistency with how that particular processor communicated. To implement this hypothetical example in practice, a consideration of the overhead associated with the hypothetical implementation versus having an inconsistency may be appropriate. In some cases, it may be more efficient with respect to an overall system to have multiple translations that, in effect, cancel each other out with respect to a single expansion card.

Figure 6:
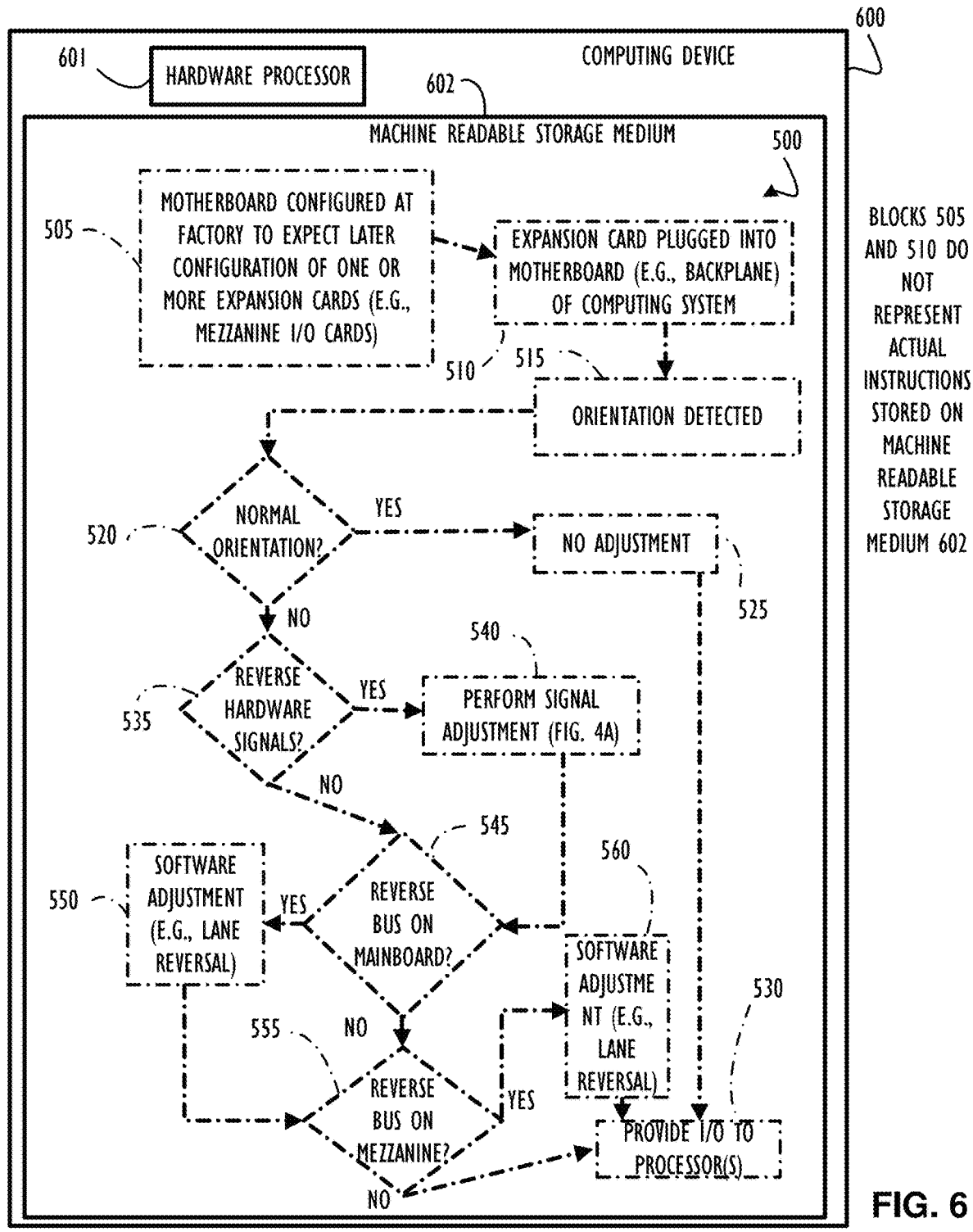
FIG. 6 illustrates an example computing device, with a hardware processor, and a non-transitory memory including instructions to contain the firmware and/or software for a portion of the method of FIG. 5, according to one or more disclosed implementations.

Referring to FIG. 6, shown is an example computing device 600, with a hardware processor 601, and accessible machine-readable instructions stored on a machine-readable storage medium 602 that may be used to implement automatic detection and adjustments based on expansion card orientation as explained above for example method 500, according to one or more disclosed example implementations. Hardware processor 601 may also be referred to by those of ordinary skill in the art as a processing unit, processing device, processor or some other term considered appropriate for a general purpose programmable integrated circuit. FIG. 6 illustrates computing device 600 configured to perform the flow of example method 500. However, computing device 600 may also be configured to perform the flow of other methods, techniques, functions, or processes described in this disclosure. In this example of FIG. 6, machine-readable storage medium 602 includes instructions to cause hardware processor 601 to perform blocks 515-560 discussed above with reference to FIG. 5. Blocks 505 and 510 are illustrated in FIG. 6 for consistency but would not be implemented, in practice, as part of the instructions on machine readable storage medium 602.

A machine-readable storage medium, such as 602 of FIG. 6, may include both volatile and nonvolatile, removable and non-removable media, and may be any electronic, magnetic, optical, or other physical storage device that contains or stores executable instructions, data structures, program module, or other data accessible to a processor, for example firmware, erasable programmable read-only memory (EPROM), random access memory (RAM), non-volatile random access memory (NVRAM), optical disk, solid state drive (SSD), flash memory chips, and the like. The machine-readable storage medium may be a non-transitory storage medium, where the term "non-transitory" does not encompass transitory propagating signals.

Figure 7:
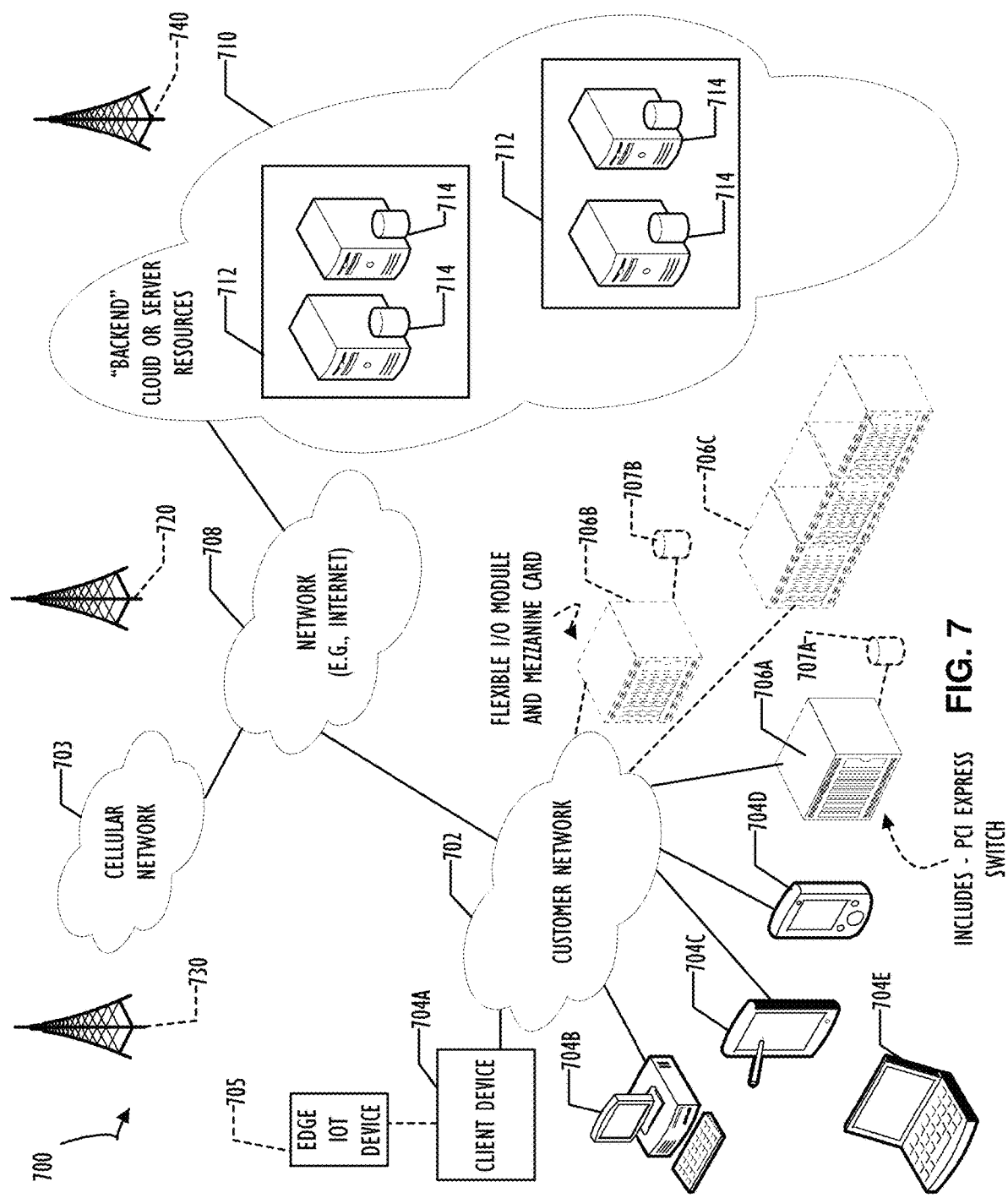
FIG. 7 presents a computer network infrastructure that may be used to implement all or part of the disclosed mezzanine expansion card flexible I/O capabilities for connected compute nodes, according to one or more disclosed implementations.

FIG. 7 represents a computer network infrastructure 700 where implementations of all or part of the flexible I/O module (i.e., data fabric connector 210) and corresponding mezzanine expansion cards (see FIGS. 1-2E) may be present for one or more connected compute nodes (see FIGS. 3A-F), according to one or more disclosed implementations. Network infrastructure 700 includes a set of networks where implementations of the present disclosure may operate in one or more of the different networks. Network infrastructure 700 comprises a customer network 702, network 708, cellular network 703, and a cloud service provider network 710. In one implementation, the customer network 702 may be a local private network, such as local area network (LAN) that includes a variety of network devices that include, but are not limited to switches, servers, and routers. Each computing device may benefit from disclosed flexible I/O techniques that include automatic expansion card orientation adjustment as disclosed herein. Some devices (e.g., compute resource 706A may provide functionality of a PCIe switch (e.g., a fan-out device) or other device that provides I/O bus expansions.

Each of these networks may contain wired or wireless programmable devices and operate using any number of network protocols (e.g., TCP/IP) and connection technologies (e.g., WiFi® networks, or Bluetooth®. In another implementation, customer network 702 represents an enterprise network that could include or be communicatively coupled to one or more local area networks (LANs), virtual networks, data centers and/or other remote networks (e.g., 708, 710). In the context of the present disclosure, customer network 702 may include one or more high-availability switches or network devices using methods and techniques such as those described above. For example, as noted in FIG. 7, devices to provide compute resources 706A and/or 706B may incorporate one or more of the above disclosed flexible I/O mezzanine expansion cards.

As shown in FIG. 7, customer network 702 may be connected to one or more client devices 704A-E and allow the client devices 704A-E to communicate with each other and/or with cloud service provider network 710, via network 708 (e.g., Internet). Client devices 704A-E may be computing systems such as desktop computer 704B, tablet computer 704C, mobile phone 704D, laptop computer (shown as wireless) 704E, and/or other types of computing systems generically shown as client device 704A.

Network infrastructure 700 may also include other types of devices generally referred to as Internet of Things (IoT) (e.g., edge IOT device 705) that may be configured to send and receive information via a network to access cloud computing services or interact with a remote web browser applications (as examples).

FIG. 7 also illustrates that customer network 702 includes local compute resources 706A-C that may include a server, access point, router, or other device configured to provide for local computational resources and/or facilitate communication amongst networks and devices. For example, local compute resources 706A-C may be one or more physical local hardware devices, such as the network infrastructure devices outlined above. Local compute resources 706A-C may also facilitate communication between other external applications, data sources (e.g., 707A and 707B), and services, and customer network 702.

Network infrastructure 700 also includes cellular network 703 for use with mobile communication devices. Mobile cellular networks support mobile phones and many other types of mobile devices such as laptops etc. Mobile devices in network infrastructure 700 are illustrated as mobile phone 704D, laptop computer 704E, and tablet computer 704C. A mobile device such as mobile phone 704D may interact with one or more mobile provider networks as the mobile device moves, typically interacting with a plurality of mobile network towers 720, 730, and 740 for connecting to the cellular network 703.

FIG. 7 illustrates that customer network 702 is coupled to a network 708. Network 708 may include one or more computing networks available today, such as other LANs, wide area networks (WAN), the Internet, and/or other remote networks, in order to transfer data between client devices 704A-D and cloud service provider network 710. Each of the computing networks within network 708 may contain wired and/or wireless programmable devices that operate in the electrical and/or optical domain.

In FIG. 7, cloud service provider network 710 is illustrated as a remote network (e.g., a cloud network) that is able to communicate with client devices 704A-E via customer network 702 and network 708. The cloud service provider network 710 acts as a platform that provides additional computing resources to the client devices 704A-E and/or customer network 702. In one implementation, cloud service provider network 710 includes one or more data centers 712 with one or more server instances 714. Cloud service provider network 710 may also include one or more frames or clusters (and cluster groups) representing a scalable compute resource that may benefit from the techniques of this disclosure. Also, cloud service providers typically seek to provide near perfect uptime availability and may use the disclosed techniques, methods, and systems to provide that level of service.

Figure 8:
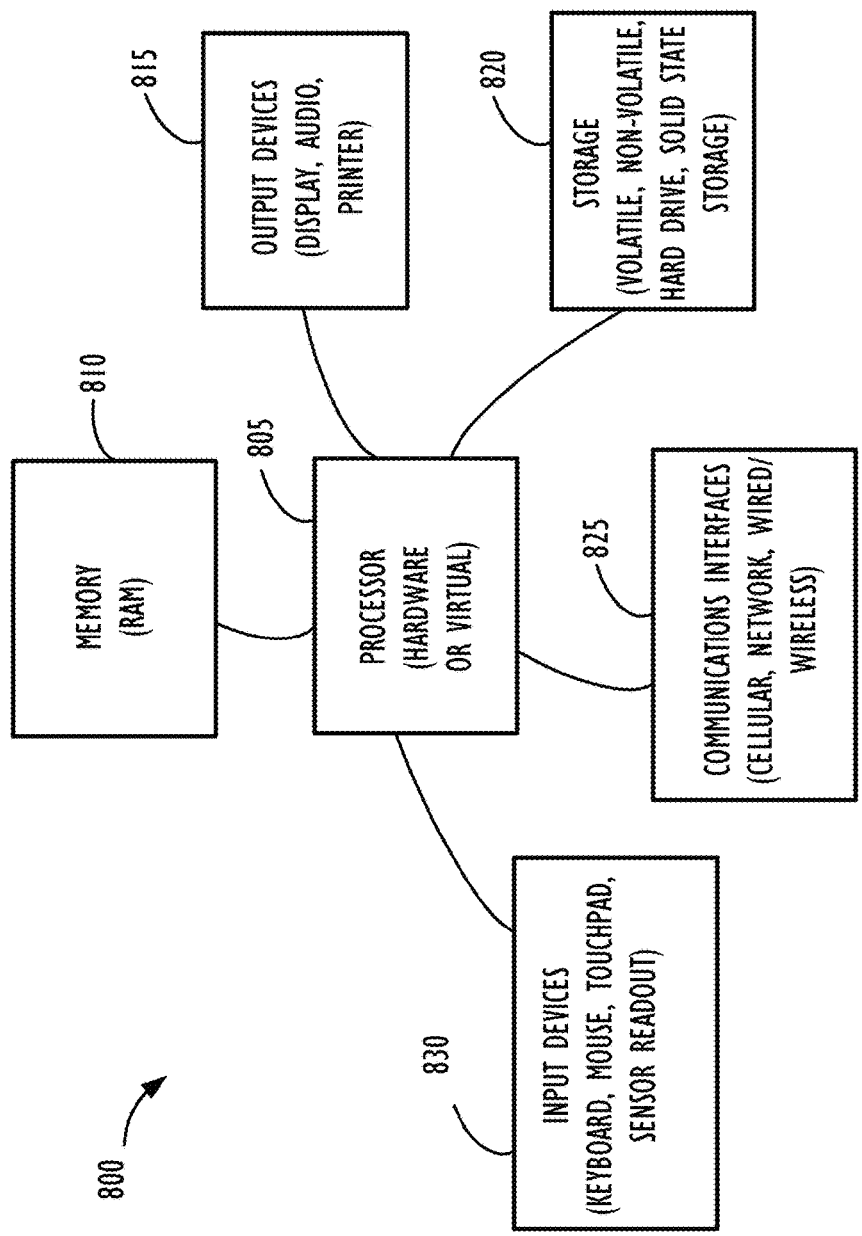
FIG. 8 illustrates a computing device that may be used to implement the functions, modules, processing platforms, execution platforms, communication devices, and other methods and processes of this disclosure.

FIG. 8 illustrates a computing device 800 that may be used to implement or be used with the functions, modules, processing platforms, execution platforms, communication devices, and other methods and processes of this disclosure. For example, computing device 800 illustrated in FIG. 8 could represent a client device or a physical server device and include either hardware or virtual processor(s) depending on the level of abstraction of the computing device. In some instances (without abstraction), computing device 800 and its elements, as shown in FIG. 8, each relate to physical hardware. Alternatively, in some instances one, more, or all of the elements could be implemented using emulators or virtual machines as levels of abstraction. In any case, no matter how many levels of abstraction away from the physical hardware, computing device 800 at its lowest level may be implemented on physical hardware.

As also shown in FIG. 8, computing device 800 may include one or more input devices 830, such as a keyboard, mouse, touchpad, or sensor readout (e.g., biometric scanner) and one or more output devices 815, such as displays, speakers for audio, or printers. Some devices may be configured as input/output devices also (e.g., a network interface or touchscreen display).

Computing device 800 may also include communications interfaces 825, such as a network communication unit that could include a wired communication component and/or a wireless communications component, which may be communicatively coupled to processor 805. The network communication unit may utilize any of a variety of proprietary or standardized network protocols, such as Ethernet, TCP/IP, to name a few of many protocols, to effect communications between devices (e.g., via a network fabric). Network communication units may also comprise one or more transceiver(s) that utilize the Ethernet, power line communication (PLC), WiFi, cellular, and/or other communication methods.

As illustrated in FIG. 8, computing device 800 includes a processing element such as processor 805 that contains one or more hardware processors, where each hardware processor may have a single or multiple processor cores. In one implementation, the processor 805 may include at least one shared cache that stores data (e.g., computing instructions) that are utilized by one or more other components of processor 805. For example, the shared cache may be a locally cached data stored in a memory for faster access by components of the processing elements that make up processor 805. In one or more implementations, the shared cache may include one or more mid-level caches, such as level 2 (L2), level 3 (L3), level 4 (L4), or other levels of cache, a last level cache (LLC), or combinations thereof. Examples of processors include but are not limited to a central processing unit (CPU) a microprocessor. Although not illustrated in FIG. 8, the processing elements that make up processor 805 may also include one or more of other types of hardware processing components, such as graphics processing units (GPU), application specific integrated circuits (ASICs), field-programmable gate arrays (FPGAs), and/or digital signal processors (DSPs).

FIG. 8 illustrates that memory 810 may be operatively and communicatively coupled to processor 805. Memory 810 may be a non-transitory medium configured to store various types of data. For example, memory 810 may include one or more storage devices 820 that comprise a non-volatile storage device and/or volatile memory. Volatile memory, such as random-access memory (RAM), can be any suitable non-permanent storage device. The non-volatile storage devices 820 can include one or more disk drives, optical drives, solid-state drives (SSDs), tap drives, flash memory, read only memory (ROM), and/or any other type of memory designed to maintain data for a duration of time after a power loss or shut down operation. In certain instances, the non-volatile storage devices 820 may be used to store overflow data if allocated RAM is not large enough to hold all working data. The non-volatile storage devices 820 may also be used to store programs that are loaded into the RAM when such programs are selected for execution.

Persons of ordinary skill in the art are aware that software programs may be developed, encoded, and compiled in a variety of computing languages for a variety of software platforms and/or operating systems and subsequently loaded and executed by processor 805. In one implementation, the compiling process of the software program may transform program code written in a programming language to another computer language such that the processor 805 is able to execute the programming code. For example, the compiling process of the software program may generate an executable program that provides encoded instructions (e.g., machine code instructions) for processor 805 to accomplish specific, non-generic, particular computing functions. As discussed herein, translation of bus communication responsive to automatic detection of orientation of a flexible I/O mezzanine expansion card may be implemented via a combination of hardware and/or software components.

After the compiling process, the encoded instructions may then be loaded as computer executable instructions or process steps to processor 805 from storage device 820, from memory 810, and/or embedded within processor 805 (e.g., via a cache or on-board ROM). Processor 805 may be configured to execute the stored instructions or process steps in order to perform instructions or process steps to transform the computing device into a non-generic, particular, specially programmed machine or apparatus. Stored data, e.g., data stored by a storage device 820, may be accessed by processor 805 during the execution of computer executable instructions or process steps to instruct one or more components within the computing device 800.

A user interface (e.g., output devices 815 and input devices 830) can include a display, positional input device (such as a mouse, touchpad, touchscreen, or the like), keyboard, or other forms of user input and output devices. The user interface components may be communicatively coupled to processor 805. When the output device is or includes a display, the display can be implemented in various ways, including by a liquid crystal display (LCD) or a cathode-ray tube (CRT) or light emitting diode (LED) display, such as an organic light emitting diode (OLED) display. Persons of ordinary skill in the art are aware that the computing device 800 may comprise other components well known in the art, such as sensors, powers sources, and/or analog-to-digital converters, not explicitly shown in FIG. 8.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A computer device, comprising:
   a mainboard comprising:
     multiple slots to accept one or more input/output (I/O) cards, each of the one or more I/O cards utilizing a single one of the multiple slots or two of the multiple slots simultaneously, the multiple slots including a first slot and a second slot;
     a first central processing unit (CPU) associated with a first communication bus connection to the first slot; and
     a second CPU associated with a second bus communication connection to the second slot, the second communication bus being separate from the first communication bus; and
   a first mezzanine expansion card providing a first percentage of input/output bandwidth to the first CPU and a second percentage of input/output bandwidth to the second CPU, the first mezzanine expansion card comprising:
     a first connection plugin; and
     a second connection plugin,
     the first mezzanine expansion card concurrently connected to the first slot and the second slot using the first connection plugin and the second connection plugin and capable of operating in both a first orientation with the first connection plugin connected to the first slot and the second connection plugin connected to the second slot or a second orientation with the first connection plugin connected to the second slot and the second connection plugin connected to the first slot;
     wherein the second orientation comprises a reverse orientation which is rotated 180 degrees from the first orientation.

2. The computer device of claim 1, wherein the first mezzanine expansion card allows changing between the first orientation to the second orientation by rotating the first mezzanine expansion card 180 degrees.

3. The computer device of claim 2, wherein the first communication bus and the second communication bus are Peripheral Component Interconnect Express (PCIe) busses that automatically adapt to the first orientation or the second orientation by altering pin out communication paths for each PCIe bus.

4. The computer device of claim 3, wherein altering pin out communication paths for each PCIe bus includes altering hardware communication paths on the mainboard between the first CPU and the first slot.

5. The computer device of claim 3, wherein altering pin out communication paths for each PCIe bus includes altering, via PCIe lane reversal on the mainboard, communication paths between the first CPU and the first slot.

6. The computer device of claim 3, wherein altering pin out communication paths for each PCIe bus includes altering, via PCIe lane reversal on the first mezzanine expansion card, communications for the first PCIe bus.

7. The computer device of claim 1, wherein the first percentage and the second percentage are equal, and a total input/output bandwidth of the first mezzanine expansion card is shared between the first CPU and the second CPU.

8. The computer device of claim 1, wherein the first percentage and the second percentage are different by at least 10% of a total input/output bandwidth of the first mezzanine expansion card with the first CPU having available a larger percentage of the total input/output bandwidth than the second CPU.

9. The computer device of claim 1, wherein the mainboard further comprises:
   a third CPU associated with a third communication bus connection to a third slot;
   a fourth CPU associated with a fourth communication bus connection to a fourth slot; and
   a second mezzanine expansion card providing a third percentage of input/output bandwidth to the third CPU and a fourth percentage of input/output to the fourth CPU, the second mezzanine expansion card comprising:
     a third connection plugin; and
     a fourth connection plugin,
     the second mezzanine expansion card concurrently connected to the third slot and the fourth slot using the third connection plugin and the fourth connection plugin and capable of operating in both a third orientation with the third connection plugin connected to the third slot and the fourth connection plugin connected to the fourth slot or a fourth orientation with the third connection plugin connected to the fourth slot and the fourth connection plugin connected to the third slot.

10. The computer device of claim 9, wherein the first orientation and the third orientation are a normal orientation, and the second orientation and the fourth orientation are a reverse orientation.

11. The computer device of claim 9, wherein the first mezzanine expansion card and the second mezzanine expansion card are different instances of identical mezzanine expansion cards concurrently providing input/output bandwidth for multiple server instances of the computer device.

12. The computer device of claim 11, wherein the first mezzanine expansion card is inserted in a normal orientation and the second mezzanine expansion card is inserted in a reverse orientation.

13. The computer device of claim 11, wherein the first CPU is associated with a first server instance of the computer device and the second CPU is associated with a second server instance of the computer device.

14. The computer device of claim 11, wherein:
   the first CPU and the second CPU are concurrently associated with a first server instance of the computer device; and the third CPU and the fourth CPU are concurrently associated with a second server instance of the computer device.

15. The computer device of claim 1, wherein the first CPU is associated with a first server instance of the computer device and the second CPU is associated with a second server instance of the computer device.

16. A mezzanine expansion card providing a first percentage of input/output bandwidth to a first CPU and a second percentage of input/output bandwidth to a second CPU, the mezzanine expansion card comprising:
   a first connection plugin to support a first communication bus to the first CPU; and
   a second connection plugin to support a second communication bus to the second CPU, the first and second communication busses independent of each other and concurrently operable,
   the first mezzanine expansion card for concurrent connection to a first slot of a mainboard and a second slot of the mainboard using the first connection plugin and the second connection plugin and capable of operating in both a first orientation with the first connection plugin connected to the first slot and the second connection plugin connected to the second slot or a second orientation with the first connection plugin connected to the second slot and the second connection plugin connected to the first slot,
   wherein the second orientation comprises a reverse orientation which is rotated 180 degrees from the first orientation.

17. The mezzanine expansion card of claim 16, wherein at least one of the first connection plugin or the second connection plugin provides a signal, upon activation after plugin to a mainboard, to indicate an insertion orientation of the mezzanine expansion card with respect to pin outs of the first slot and the second slot.

18. The mezzanine expansion card of claim 17, wherein the signal provides information which allows for the mainboard to determine either a normal orientation or a reverse orientation for a connector interface between the mainboard and the mezzanine expansion card.

19. The mezzanine expansion card of claim 18, wherein the mezzanine expansion card implements altered pin out communication paths, via Peripheral Component Interconnect Express ("PCIe") lane reversal on the mezzanine expansion card, responsive to an indication of the reverse orientation being detected by the mainboard.

20. The mezzanine expansion card of claim 16, wherein the mezzanine expansion card is a double width mezzanine expansion card or a quad width mezzanine expansion card.

* * * * *